United States Patent
Kodama et al.

(10) Patent No.: US 10,649,335 B2
(45) Date of Patent: May 12, 2020

(54) SUBSTRATE PROCESSING APPARATUS, SUBSTRATE PROCESSING METHOD AND STORAGE MEDIUM

(71) Applicant: TOKYO ELECTRON LIMITED, Tokyo (JP)

(72) Inventors: Teruhiko Kodama, Koshi (JP); Masashi Enomoto, Koshi (JP); Masahide Tadokoro, Koshi (JP); Takafumi Hashimoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 246 days.

(21) Appl. No.: 15/760,206

(22) PCT Filed: Aug. 26, 2016

(86) PCT No.: PCT/JP2016/075001
§ 371 (c)(1),
(2) Date: Mar. 14, 2018

(87) PCT Pub. No.: WO2017/047355
PCT Pub. Date: Mar. 23, 2017

(65) Prior Publication Data
US 2018/0253007 A1 Sep. 6, 2018

(30) Foreign Application Priority Data

Sep. 15, 2015 (JP) ................. 2015-181940

(51) Int. Cl.
| | | |
|---|---|---|
| G03F 7/16 | (2006.01) |
| B05C 9/14 | (2006.01) |
| B05C 11/08 | (2006.01) |
| G01B 11/06 | (2006.01) |
| G01B 11/24 | (2006.01) |
| H01L 21/67 | (2006.01) |
| H01L 21/677 | (2006.01) |
| H01L 21/68 | (2006.01) |
| H01L 21/027 | (2006.01) |
| G01B 11/02 | (2006.01) |
| G03F 7/11 | (2006.01) |
| H01L 21/02 | (2006.01) |
| H01L 21/66 | (2006.01) |

(52) U.S. Cl.
CPC ............. *G03F 7/162* (2013.01); *B05C 9/14* (2013.01); *B05C 11/08* (2013.01); *G01B 11/022* (2013.01); *G01B 11/06* (2013.01); *G01B 11/2433* (2013.01); *G03F 7/11* (2013.01); *G03F 7/168* (2013.01); *H01L 21/0271* (2013.01); *H01L 21/0276* (2013.01); *H01L 21/02115* (2013.01); *H01L 21/02282* (2013.01); *H01L 21/6715* (2013.01); *H01L 21/67178* (2013.01); *H01L 21/67253* (2013.01); *H01L 21/67259* (2013.01); *H01L 21/67288* (2013.01); *H01L 21/67742* (2013.01); *H01L 21/67766* (2013.01); *H01L 21/681* (2013.01); *H01L 22/12* (2013.01); *H01L 22/20* (2013.01)

(58) Field of Classification Search
CPC . G03F 7/162; G03F 7/168; G03F 7/11; B05C 9/14; B05C 11/08; G01B 11/06; G01B 11/2433; G01B 11/022; H01L 21/67259; H01L 21/67178; H01L 21/67766; H01L 21/67288; H01L 21/67742; H01L 21/681; H01L 21/0271; H01L 21/6715; H01L 21/67253; H01L 21/02115
USPC .......................................... 430/30
See application file for complete search history.

(56) References Cited

FOREIGN PATENT DOCUMENTS

JP 2010-219528 A 9/2010

OTHER PUBLICATIONS

International Search Report dated Nov. 22, 2016 issued in corresponding International Application No. PCT/JP2016/075001.

*Primary Examiner* — Christopher G Young
(74) *Attorney, Agent, or Firm* — Nath, Goldberg & Meyer; Jerald L. Meyer

(57) ABSTRACT

A substrate processing method, includes acquiring a height distribution along a radial direction of a substrate in a peripheral edge portion of a front surface of the substrate, forming an underlayer film on the entire front surface of the substrate so as to correct a drop of a height of the peripheral edge portion based on the height distribution, and forming a resist film on the entire surface of the underlayer film.

14 Claims, 26 Drawing Sheets

SUBSTRATE PROCESSING APPARATUS, SUBSTRATE PROCESSING METHOD AND STORAGE MEDIUM

This is a National Phase Application filed under 35 U.S.C. 371 as a national stage of PCT/CN2016/075001, filed Aug. 26, 2016, an application claiming the benefit of Japanese Application No. 2015-181940, filed Sep. 15, 2015, the content of each of which is hereby incorporated by reference in its entirety.

TECHNICAL FIELD

The present disclosure relates to a substrate processing method for forming an underlayer film provided under a resist film, a substrate processing apparatus and a storage medium.

BACKGROUND

In a photolithography process, which is one type of process for manufacturing a semiconductor device, a resist pattern is formed on a semiconductor wafer (hereinafter referred to as a wafer) which is a substrate. In order to form the resist pattern, for example, the wafer is transferred to a coating and developing apparatus for coating and developing a resist and is subjected to a resist coating process. Thereafter, the wafer is transferred to an exposure apparatus connected to the coating and developing apparatus and is exposed along a desired pattern.

The peripheral edge portion of the front surface of the wafer is configured as an inclined surface descending outward. Further, in the above-described coating and developing apparatus, there may be loaded a wafer (hereinafter sometimes referred to as a polished wafer) on which formation of a film and removal of the film by CMP (Chemical Mechanical Polishing) are performed in a manufacturing process of a semiconductor device until the wafer is loaded into the coating and developing apparatus. The formation of the film and the removal of the film may be repeated a plurality of times. As the number of repetitions increases, an edge roll-off amount, which is a difference (drop amount) between the height of the upper end of the inclined surface and the height at a position shifted by a predetermined distance from the upper end of the inclined surface toward the outside of the wafer, tends to increase.

Moreover, in the above-described exposure apparatus, leveling correction is performed in which the wafer is inclined so that the focus surface and the front surface of the wafer in the region to be subjected to an exposure process are aligned with each other. When an exposure process is performed in a peripheral edge region including the peripheral edge portion of the wafer and a more inner side than the peripheral edge portion, the focus surface and the front surface of the wafer can be aligned by the leveling correction on the more inner side than the peripheral edge portion of the wafer. However, if the aforementioned edge roll-off is relatively large in the peripheral edge portion, namely if the difference in height between the focus surface and the front surface of the wafer is relatively large, defocusing (focus abnormality) may occur. In such a case, the size of a CD (Critical Dimension) which is a line width of a resist pattern may be changed from a designed value. Thus, the yield of semiconductor products in the peripheral edge region decreases. Under the foregoing circumstances, there is a need to maintain a CD at a designed value even in the peripheral edge region and to raise the yield of semiconductor products. In a Patent Document 1, an exposure apparatus is disclosed which is provided with a leveling sensor for measuring the height of a front surface of a substrate. However, a method for solving the above problem is not disclosed.

[Patent Document]

Patent Document 1: Japanese Application Publication No.: 2010-219528

SUMMARY

Some embodiments of the present disclosure provide a technique capable of preventing an abnormal resist pattern from being formed in a peripheral edge portion of a substrate.

According to one embodiment of the present disclosure, there is provided a substrate processing method, including: acquiring a height distribution along a radial direction of a substrate in a peripheral edge portion of a front surface of the substrate, forming an underlayer film on the entire front surface of the substrate so as to correct a drop of a height of the peripheral edge portion based on the height distribution, and forming a resist film on the entire surface of the underlayer film.

According to another embodiment of the present disclosure, there is provided a substrate processing apparatus, including: a height distribution acquisition module configured to acquire a height distribution along a radial direction of a substrate in a peripheral edge portion of a front surface of the substrate; and an underlayer film forming module configured to form an underlayer film, which is provided under a resist film, on the entire front surface of the substrate so as to correct a drop of a height of the peripheral edge portion based on the height distribution.

According to another embodiment of the present disclosure, there is provided a non-transitory computer-readable storage medium storing a computer program used for a substrate processing apparatus configured to form an underlayer film, which is provided under a resist film, on a substrate, wherein the program incorporates processes for executing the substrate processing method of the present disclosure.

According to the present disclosure, the underlayer film is formed on the entire front surface of the substrate so that the height distribution along the radial direction of the substrate in the peripheral edge portion of the front surface of the substrate and the drop of the height in the peripheral edge portion are corrected on the basis of the height distribution. Therefore, in the peripheral edge portion of the substrate, it is possible to prevent the focus during exposure from being deviated with respect to the surface of the resist film formed on the underlayer film. As a result, it is possible to prevent an abnormal resist pattern from being formed in the peripheral edge portion.

DETAILED DESCRIPTION

Figure 1:
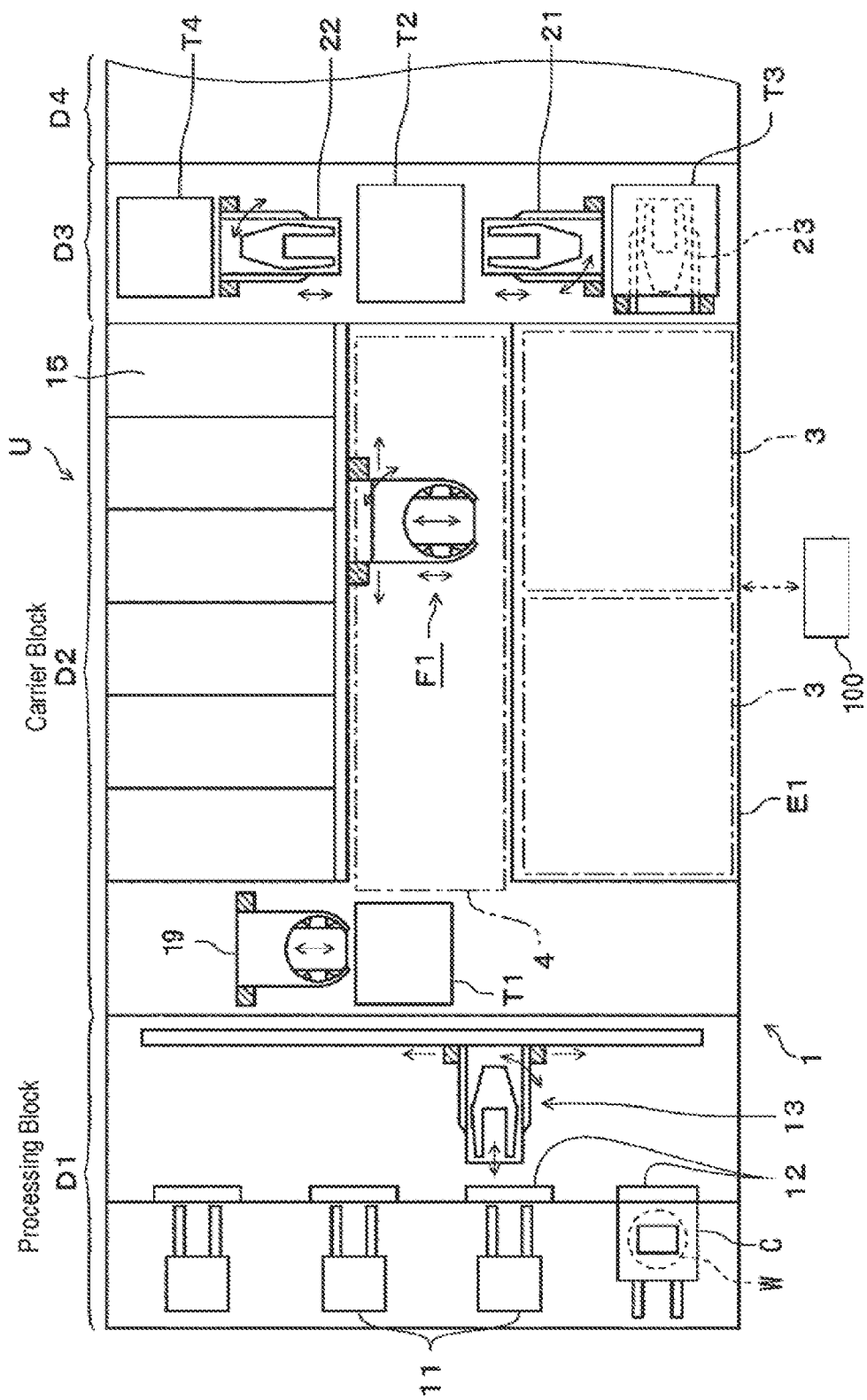
FIG. 1 is a detailed plan view of a coating and developing apparatus.
Figure 2:
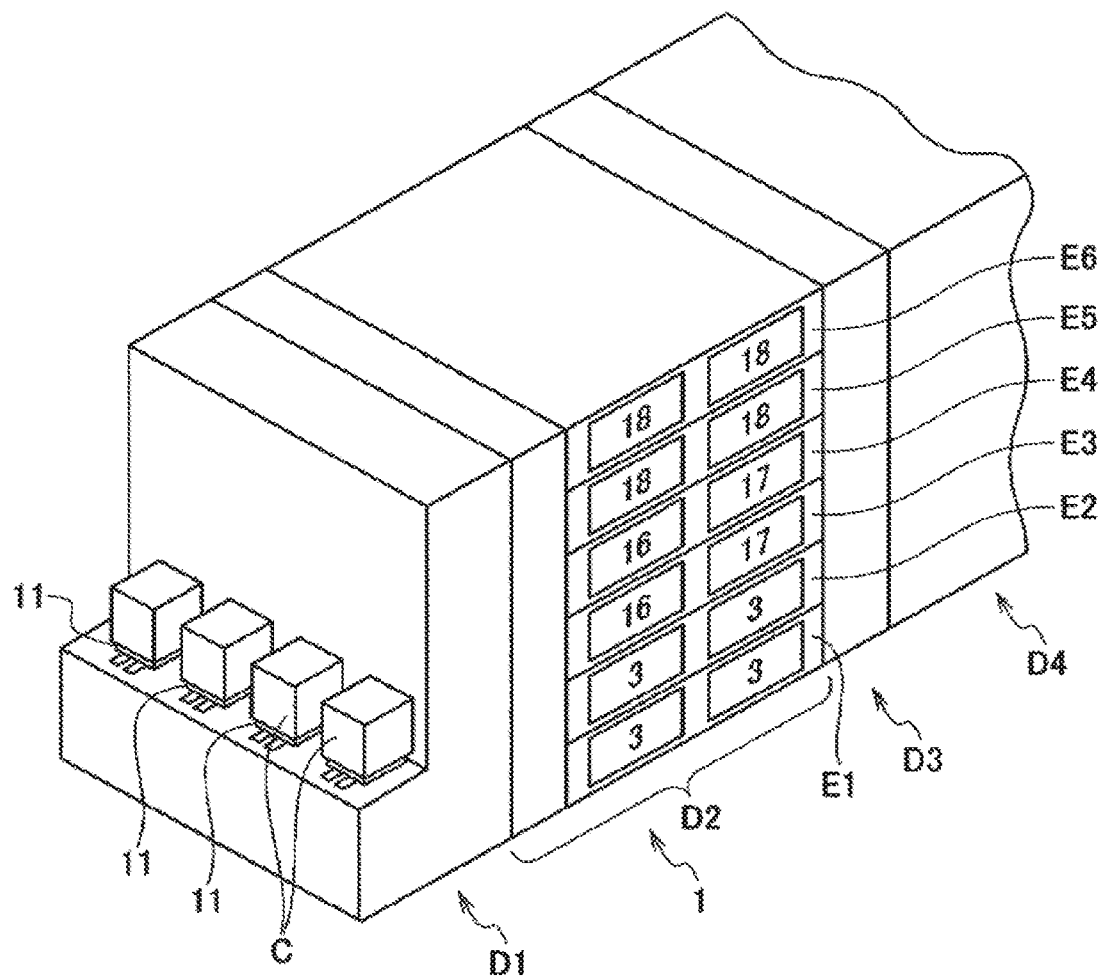
FIG. 2 is a perspective view of the coating and developing apparatus.
Figure 3:
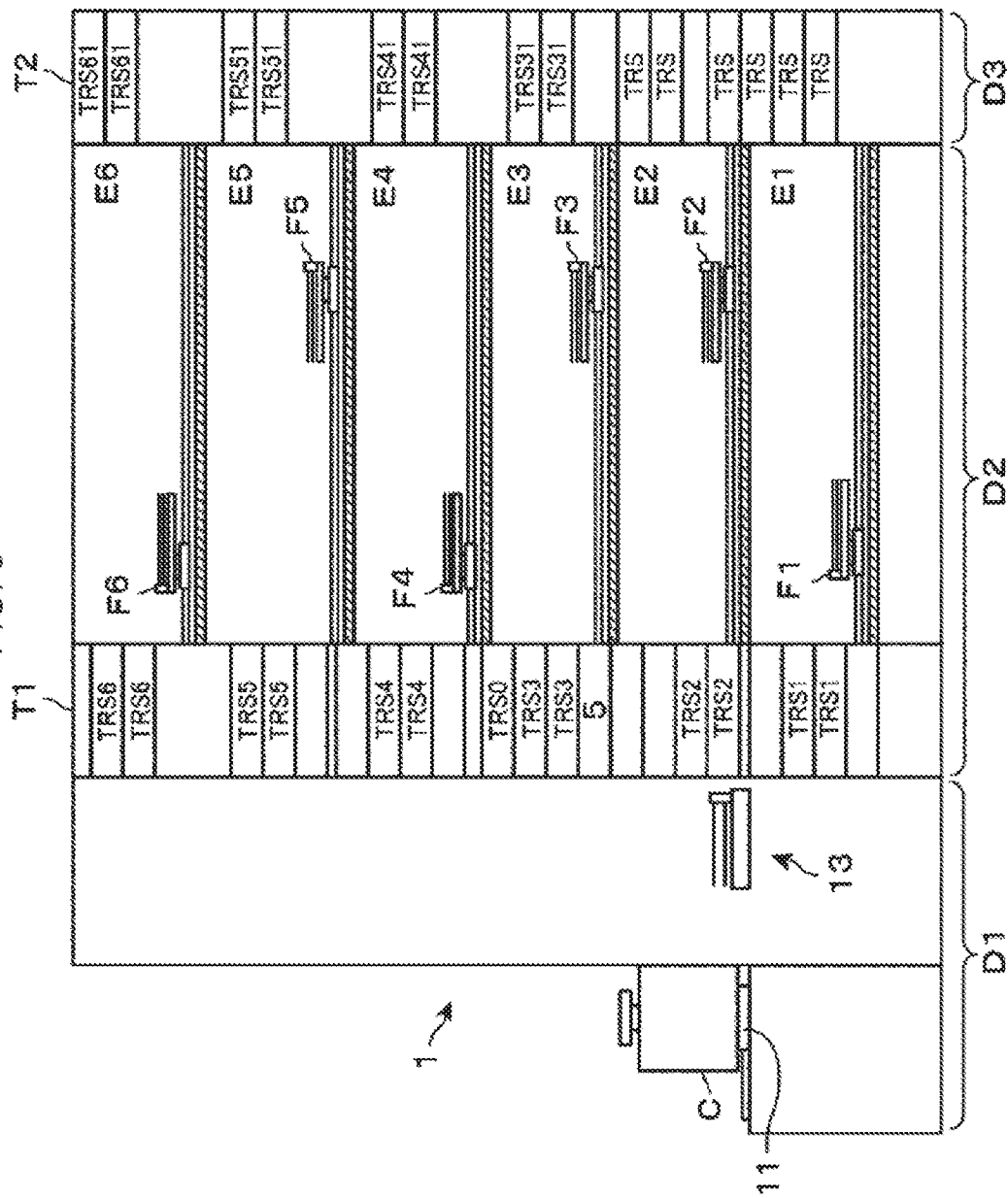
FIG. 3 is a schematic vertical sectional side view of the coating and developing apparatus.

A coating and developing apparatus 1 according to an embodiment of a substrate processing apparatus of the present disclosure will be described with reference to FIGS. 1 to 3. FIGS. 1, 2 and 3 are a plan view, a perspective view and a schematic vertical sectional side view of the coating and developing apparatus 1. The coating and developing apparatus 1 includes a carrier block D1, a processing block D2 and an interface block D3, which are horizontally and linearly connected to one another. An exposure apparatus D4 is connected to the interface block D3 on the side opposite to the processing block D2. In the following description, unless otherwise stated, the arrangement direction of the blocks D1 to D3 and the exposure apparatus D4 is defined as a front-rear direction. In the coating and developing apparatus 1, an organic film called SOC (Spin-On-Carbon), an antireflection film and a resist film are laminated in the named order from the lower side on a front surface of a wafer W which is a circular substrate. The resist film is subjected to an exposure process in the exposure apparatus D4. After the exposure process, the resist film is subjected to a developing process in the coating and developing apparatus 1. In this example, the diameter of the wafer W is 300 mm, and a notch N which is a cutout indicating the orientation of the wafer W is provided at the peripheral edge of the wafer W.

The carrier block D1 loads and unloads a carrier C containing a plurality of wafers W to and from the coating and developing apparatus 1. The wafers W in the carrier C may be, for example, the polished wafers described in the background section of the present disclosure. Alternatively, the carrier C may store wafers W (hereinafter sometimes referred to as new wafers) on which formation of a film and removal of the film by CMP are not performed. The carrier block D1 includes mounting tables 11 for the carrier C, opening/closing parts 12 and a transfer mechanism 13 for transferring the wafer W from the carrier C via the opening/closing parts 12.

The processing block D2 is configured by stacking first to sixth unit blocks E1 to E6 for performing liquid processing on the wafer W, sequentially from below. E1 and E2 are the same unit blocks, E3 and E4 are the same unit blocks, and E5 and E6 are the same unit blocks. In the same unit blocks, the wafers W are transferred and processed in parallel with each other.

The unit block E1 out of the unit blocks will now be representatively described with reference to FIG. 1. A plurality of shelf units U is arranged in the front-rear direction on one side of a transfer region 4 extending from the carrier block D1 to the interface block D3, and two SOC film forming modules 3 are provided side by side in the front-rear direction on the other side of the transfer region 4. The SOC film forming modules 3 are modules for supplying a chemical liquid to the wafer W to form an organic film called SOC (Spin-On-Carbon) which is an underlayer film, on the front surface of the wafer W. A more specific example of the configuration of the SOC film forming modules 3 will be described later. The shelf unit U includes a heating module 15. Further, a transfer arm F1 which is a transfer mechanism for the wafer W is provided in the transfer region 4.

The difference between the unit blocks E3 to E6 and the unit blocks E1 and E2 will be described. Each of the unit blocks E3 and E4 includes an antireflection film forming module 16 and a resist film forming module 17 instead of the two SOC film forming modules 3. The antireflection film forming module 16 and the resist film forming module 17 are configured substantially in the same manner as the SOC film forming modules 3. However, the antireflection film forming module 16 and the resist film forming module 17 are differ from the SOC film forming modules 3 in the type of chemical liquid being supplied to the wafer W. The antireflection film forming module 16 supplies a chemical liquid for forming an antireflection film, and the resist film forming module 17 supplies a resist.

Each of the unit blocks E5 and E6 is provided with a developing module 18 instead of the SOC film forming modules 3. The developing module 18 is configured substantially in the same manner as the SOC film forming modules 3. However, as for the chemical liquid supplied to the wafer W, the developing module 18 supplies a developing liquid to the wafer W instead of the chemical liquid for forming the SOC film. Except for such a difference, the unit blocks E1 to E6 are configured similarly to each other. In FIG. 3, the transfer arms of the respective unit blocks E2 to E6 corresponding to the transfer arm F1 are denoted by F2 to F6.

On the side of the carrier block D1 in the processing block D2, there are provided a tower T1 extending vertically over the respective unit blocks E1 to E6 and a vertically movable transfer mechanism 19 for transferring the wafer W to and from the tower T1. The tower T1 is configured by a plurality of modules stacked one above another. The modules provided at the respective heights of the unit blocks E1 to E6 can transfer the wafers W to and from the respective transfer arms F1 to F6 of the unit blocks E1 to E6. These modules include a transfer module TRS provided at the height position of each unit block, a temperature adjustment module CPL for adjusting the temperature of the wafer W, a buffer module for temporarily storing a plurality of wafers W, and a hydrophobilization treatment module for rendering the front surface of the wafer W hydrophobic. In order to simplify the explanation, the hydrophobilization treatment module, the temperature adjustment module and the buffer module are not shown. An imaging module 5 is provided on the tower T1. The wafer W is imaged by the imaging module 5. A film forming process is performed on the wafer W by the SOC film forming module 3 under the processing conditions corresponding to the imaging result. The imaging module 5 will be described later in detail.

The interface block D3 includes towers T2, T3 and T4 extending vertically over the unit blocks E1 to E6. The interface block D3 includes an interface arm 21 which is a vertically movable transfer mechanism for transferring the wafers W to and from the tower T2 and the tower T3, an interface arm 22 which is a vertically movable transfer mechanism for transferring the wafers W to and from the tower T2 and the tower T4, and an interface arm 23 which is a transfer mechanism for transferring the wafers W between the tower T2 and the exposure apparatus D4.

The tower T2 is configured by stacking one above another a transfer module TRS, a buffer module that stores and holds a plurality of wafers W before an exposure process, a buffer module that stores a plurality of wafers W after the exposure process, a temperature adjustment module for adjusting the temperature of the wafers W, and the like. The buffer modules and the temperature adjustment module are not shown here. Although modules are also provided in the towers T3 and T4, descriptions of these modules will be omitted.

Next, a control part 100 provided in the coating and developing apparatus 1 will be described. The control part 100 is, for example, a computer, and includes a program storage part (not shown). A program incorporating instructions (step group) is stored in the program storage part so as to be able to perform the processing of the wafers W in the respective modules and the transfer of the wafers W between the modules by the respective transfer mechanisms. The processing of the wafers W in the respective modules includes acquiring a height distribution in the peripheral edge portion of the wafer W by the imaging module 5 to be described later and setting of an opening degree of a damper 39 by the SOC film forming module 3 based on the acquired height distribution. Control signals are outputted from the control part 100 to the respective parts of the coating and developing apparatus 1 according to the program, whereby the operations of the respective parts of the coating and developing apparatus 1 are controlled. This program is stored in the program storage part while being stored in a storage medium such as a hard disk, a compact disk, a magneto-optical disk, a memory card, or the like.

Figure 4:
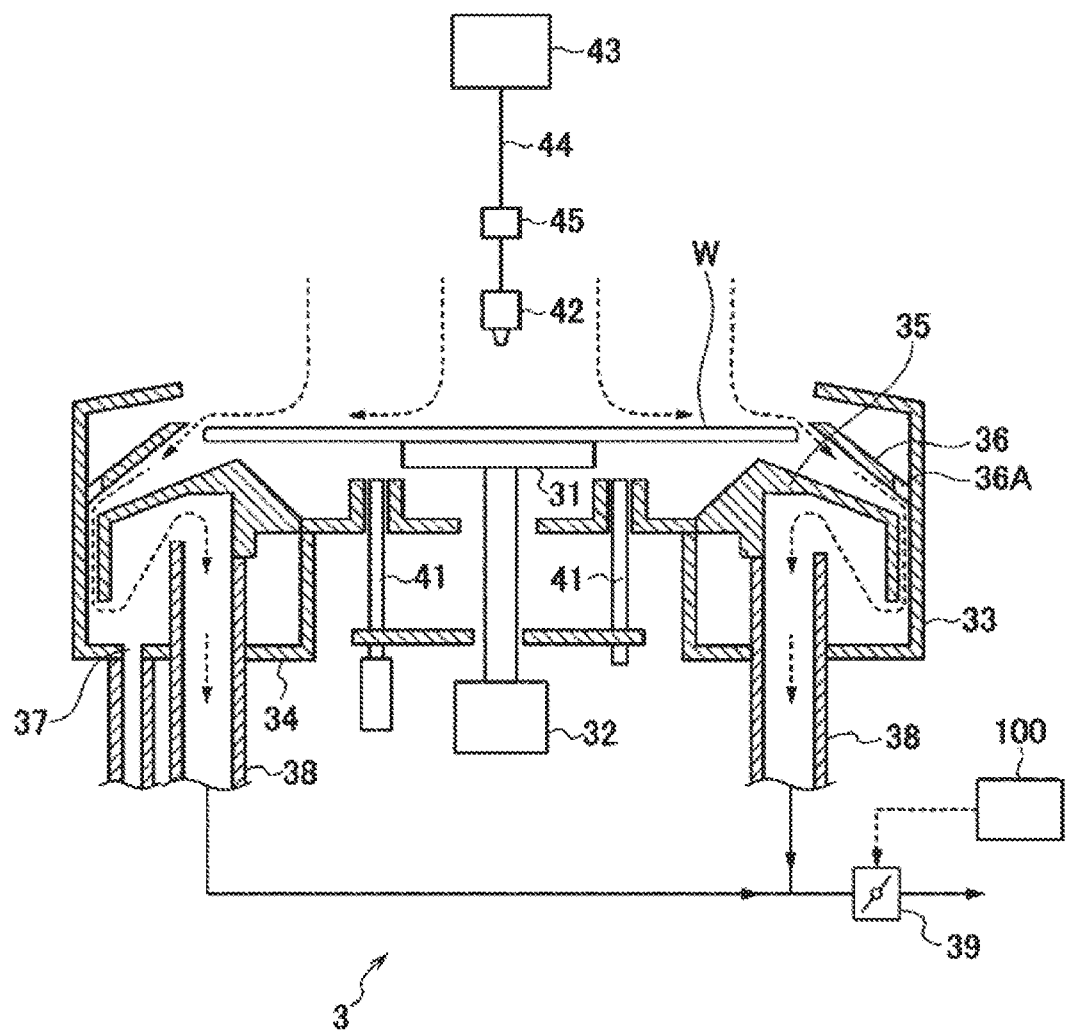
FIG. 4 is a vertical sectional side view of an SOC film forming module provided in the coating and developing apparatus.

Next, the SOC film forming module 3, which is an underlayer film forming module, will be described with reference to the vertical sectional side view of FIG. 4. In FIG. 4, reference numeral 31 denotes a spin chuck which attracts the central portion of the rear surface of the wafer W and holds the wafer W horizontally. Reference numeral 32 in FIG. 4 denotes a rotation mechanism for rotating the spin chuck 31. The rotation of the spin chuck 31 causes the wafer W to rotate about a horizontal axis. Reference numeral 33 in FIG. 4 denotes a cup whose upper side is opened. The cup 33 surrounds the periphery of the wafer W mounted on the spin chuck 31. Reference numeral 34 in FIG. 4 denotes a liquid receiving portion that constitutes the bottom portion of the cup 33. The liquid receiving portion 34 defines an annular recess opened on its upper side. Reference numeral 35 in FIG. 4 denotes a liquid guide portion which is provided below the spin chuck 31 so as to surround the spin chuck 31. In order to guide the liquid spilled downward from the wafer W to the liquid receiving portion 34, the liquid guide portion 35 includes an inclined surface and a vertical wall extending downward from the peripheral edge of the inclined surface. Reference numeral 36 in FIG. 4 denotes a plate-like liquid guide portion extending obliquely upward from the inner wall of the cup 33. The plate-like liquid guide portion receives the liquid splashed from the wafer W and guides the liquid to the liquid receiving portion 34. Reference numeral 36A in FIG. 4 denotes a through-hole penetrating the liquid guide portion 36 in the thickness direction.

The liquid receiving portion 34 is provided with a drain port 37 for discharging the chemical liquid out of the cup 33 and an exhaust pipe 38 extending upward. The air is introduced into the cup 33 from the outside of the cup 33 and is exhausted through the exhaust pipe 38. The dotted arrows in FIG. 4 indicate the flow of the air exhausted in this way. Reference numeral 39 in FIG. 4 denotes a damper installed in the exhaust pipe 38 so that the opening degree thereof can be adjusted. Exhaust is performed from the exhaust pipe 38 at an exhaust amount corresponding to the opening degree of the damper 39.

Reference numeral 41 in FIG. 4 denotes vertically movable pins provided around the spin chuck 31 (only two of which are shown in FIG. 4). The pins 41 deliver the wafer W between the transfer arm F1 or F2 and the spin chuck 31. Reference numeral 42 in FIG. 4 denotes a nozzle for discharging the chemical liquid for the formation of the SOC film vertically downward. The nozzle 42 is configured to be movable between the central portion of the wafer W held by the spin chuck 31 and the outside of the cup 33. Reference numeral 43 in FIG. 4 denotes a chemical liquid supply source connected to the nozzle 42 via a chemical liquid supply pipe 44. Reference numeral 45 in FIG. 4 denotes a flow rate adjustment part installed in the chemical liquid supply pipe 44. The flow rate adjustment part 45 adjusts the flow rate of the chemical liquid to be supplied to the nozzle 42.

Describing the film forming process in the SOC film forming module 3, the chemical liquid is discharged from the nozzle 42 to the central portion of the wafer W held by the spin chuck 31, and the film forming process is started. The discharged chemical liquid is spread to the peripheral edge portion of the wafer W by the centrifugal force of the rotating wafer W and is coated on the entire surface of the wafer W, whereby so-called spin coating is performed. Even after the discharge of the chemical liquid is stopped and the chemical liquid discharged onto the wafer W is spread to the peripheral edge portion of the wafer W, the rotation of the wafer W is continued in order to dry the chemical liquid to form an SOC film. Thereafter, the rotation of the wafer W is stopped, and the film forming process is completed.

In a period ranging from the time at which the chemical liquid is spread to the peripheral end of the wafer W by the above-described spin coating to a predetermined time at which the drying of the SOC film is not performed sufficiently (referred to as a chemical liquid drying period), as the velocity of airflow flowing through the peripheral edge portion of the wafer W increases, the drying of the chemical liquid in the peripheral edge portion proceeds promptly. The film thickness distribution of the SOC film along the radial direction of the wafer W in the peripheral edge portion of the wafer W after completion of the film formation depends on the drying speed of the chemical liquid. Since the velocity of the airflow in the peripheral edge portion of the wafer W during the chemical liquid drying period depends on the opening degree of the damper 39, the film thickness distribution of the SOC film in the peripheral edge portion of the wafer W is determined by the opening degree of the damper 39. In this way, the damper 39 constitutes an adjustment mechanism for adjusting the drying speed of the chemical liquid.

Figure 5:
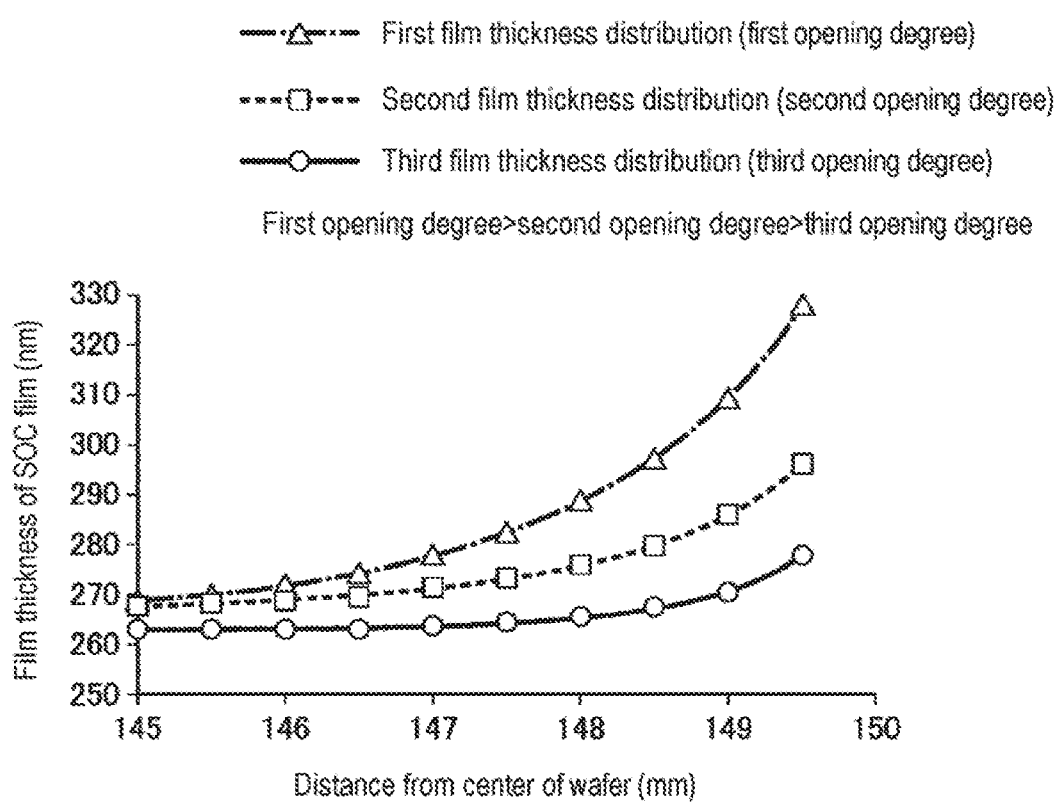
FIG. 5 is a graph showing a film thickness distribution of an SOC film formed on a wafer in the SOC film forming module.

In the SOC film forming module 3, for example, during the above-described chemical liquid drying period, the opening degree of the damper 39 may be set to any one of a first opening degree, a second opening degree and a third opening degree to perform the film forming process. In other words, in the SOC film forming module 3, the film thickness distribution of the SOC film to be formed for each wafer W may be selected. The order of magnitude of the opening degree is the first opening degree>the second opening degree>the third opening degree. By setting the first opening degree, the second opening degree and the third opening degree, the film thickness distribution along the radial direction of the wafer W in the SOC film formed in the peripheral edge portion of the wafer W after completion of the film forming process is set to a first film thickness distribution, a second film thickness distribution and a third film thickness distribution. The graph of FIG. 5 is a graph showing an example of the first to third film thickness distributions. The horizontal axis of the graph indicates the distance (unit: mm) from the center of the wafer W, and the vertical axis of the graph indicates the film thickness (unit: nm) of the formed SOC film. As shown in the graph, the larger the opening degree of the damper 39 is, the larger the film thickness in the peripheral edge portion of the wafer W is and the larger the increasing amount of the film thickness is as viewed toward the outside of the wafer W.

The reason why the SOC film forming module 3 is configured so as to be able to select the film thickness distribution for each wafer W as described above will be described with reference to FIGS. 6 to 8. As described in the background section of the present disclosure, the inclined surface 10 descending outward is formed in the peripheral edge portion of the front surface of the wafer W transferred to the coating and developing apparatus 1 (see FIG. 6). The shape of the peripheral edge portion, more specifically the height distribution along the radial direction of the front surface of the wafer W in the peripheral edge portion including the inclined surface 10, differs from wafer to wafer.

Figure 6:
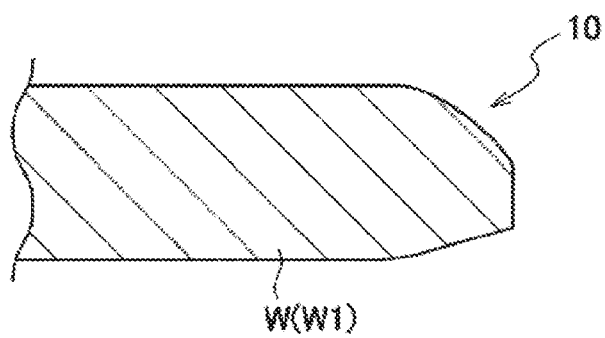
FIG. 6 is a vertical sectional side view of a wafer.
Figure 7:
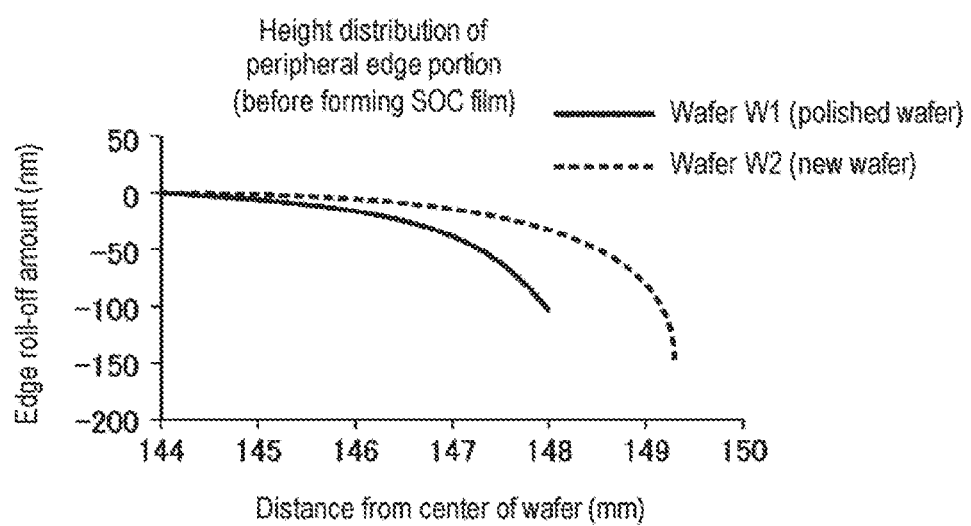
FIG. 7 is a graph showing a height distribution of an inclined surface of a wafer.

In the graph of FIG. 7, an example is shown of the height distribution along the radial direction in the peripheral edge portion of the wafer W. In the graph, the solid line indicates the height distribution of the wafer W1 as a polished wafer, and the dotted line indicates the height distribution of the wafer W2 as a new wafer. The horizontal axis of the graph indicates the distance (unit: mm) from the center of the wafer W. The vertical axis of the graph indicates the edge roll-off amount. More specifically, the vertical axis indicates the height of the surface at each position of the peripheral edge portion when assuming that the upper end of the inclined surface 10 and a more inner surface of the wafer W than the inclined surface 10 are 0 mm Therefore, in the graph of FIG. 7, the edge roll-off amount is 0 or a negative value. As the absolute value of the edge roll-off amount becomes larger, the drop from the upper end of the inclined surface 10 becomes greater. As shown in the graph, the wafer W1 and the wafer W2 differ in the height distribution of the peripheral edge portion from each other. At the position having the same distance from the center of the wafer W, the absolute value of the edge roll-off amount is greater in the wafer W1 than in the wafer W2. The wafer W shown in FIG. 6 is the wafer W1.

Since the absolute value of the edge roll-off amount is relatively large in the wafer W1 as described above, when a flat SOC film, an antireflection film and a resist film are respectively formed on the wafer W1, the absolute value of the edge roll-off amount on the surface of the resist film in the peripheral edge portion of the wafer W1 increases in the same manner as before formation of each film. Thus, as described in the background section of the present disclosure, in the peripheral edge portion of the wafer W1, the deviation between the focus surface and the resist film at the time of exposure in the exposure apparatus D4 may become large, and defocusing may occur.

Figure 8:
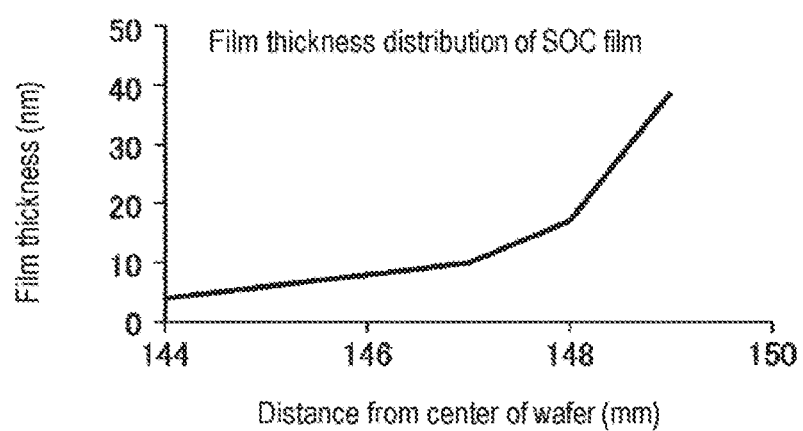
FIG. 8 is a graph showing a film thickness distribution of an SOC film formed on a wafer in the SOC film forming module.

Accordingly, in the SOC film forming module 3, the SOC film having a film thickness distribution in which the film thickness increases toward the peripheral end of the wafer W is formed so that the surface of the SOC film on the inclined surface 10 has a smaller inclination and a higher flatness than the inclined surface 10 in accordance with the height distribution in the peripheral edge portion of the front surface of the wafer W. For example, on the wafer W1 having the height distribution shown in FIG. 7, the SOC film is formed so as to have a film thickness distribution along the radial direction in the peripheral edge portion as shown in the graph of FIG. 8. The horizontal axis and the vertical axis in the graph of FIG. 8 indicate the distance from the center of the wafer W and the film thickness of the SOC film, respectively, just like the horizontal axis and the vertical axis in the graph of FIG. 5. As described above, the film thickness distribution of the SOC film formed on the wafer W in the SOC film forming module 3 is the first to third film thickness distributions shown in FIG. 5. In FIG. 8, for the convenience of description, the film thickness distribution of the SOC film different from the first to third film thickness distributions is shown.

Figure 9:
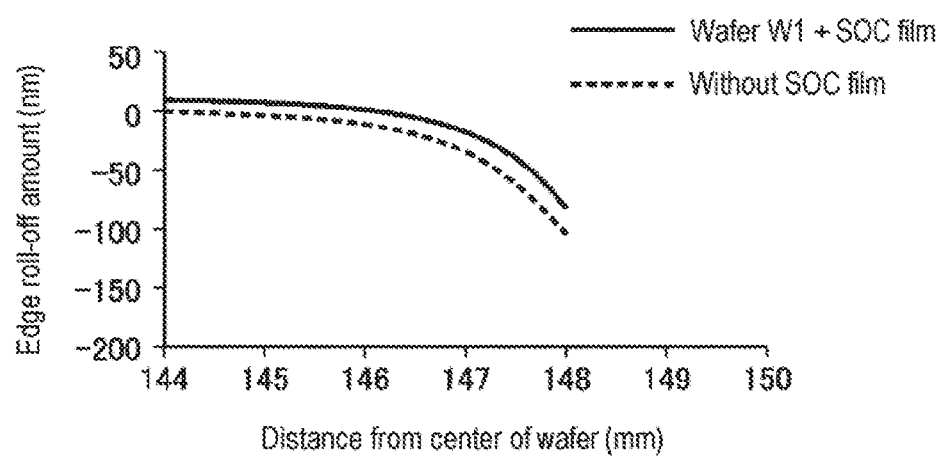
FIG. 9 is a graph showing a height distribution of a surface of an SOC film formed on a wafer in the SOC film forming module.

In the graph of FIG. 9, the height distribution of the surface of the SOC film along the radial direction of the wafer W in the case where the SOC film having the film thickness distribution shown in FIG. 8 is formed on the wafer W1 having the height distribution of the peripheral edge portion shown in FIG. 7 is indicated by a solid line. In FIG. 9, the horizontal axis and the vertical axis indicate the distance from the center of the wafer W and the edge roll-off amount, respectively, as in FIG. 7. The height distribution of the surface of the SOC film in FIG. 9 is obtained by adding the edge roll-off amount and the film thickness of the SOC film at the position having the same distance from the center of the wafer W, with respect to the height distribution of the peripheral edge portion in FIG. 7 and the film thickness distribution of the SOC film in FIG. 8.

In the graph of FIG. 9, for the sake of comparison, the height distribution of the peripheral edge portion before forming the SOC film is indicated by a dotted line. The height distribution indicated by the dotted line is the same as the one indicated by the solid line in the graph of FIG. 7. As shown in the graph of FIG. 9, by forming the SOC film having the film thickness distribution shown in FIG. 8, it is possible to suppress the lowering of the absolute value of the edge roll-off amount at various locations of the peripheral end of the wafer W. That is, the edge roll-off (the drop of height) is corrected in the peripheral edge portion of the wafer W, and the SOC film having a higher surface flatness than the inclined surface 10 is formed on the inclined surface 10. By forming the SOC film in this way, when the antireflection film and the resist film are laminated on the SOC film, the edge roll-off of the resist film in the peripheral edge portion of the wafer W is suppressed and occurrence of defocusing can be prevented.

Since the height distribution of the peripheral edge portion of the surface before formation of the SOC film varies depending on the wafer W as described above, the SOC film forming module 3 is configured so that the edge roll-off can be corrected by forming the SOC film having the film thickness distribution corresponding to the height distribution. In FIGS. 6 to 9, for the convenience of description, there is shown an example in which the SOC film is formed on the polished wafer W1 to correct the edge roll-off. However, the edge roll-off may be corrected by forming an SOC film on a new wafer W2.

Figure 10:
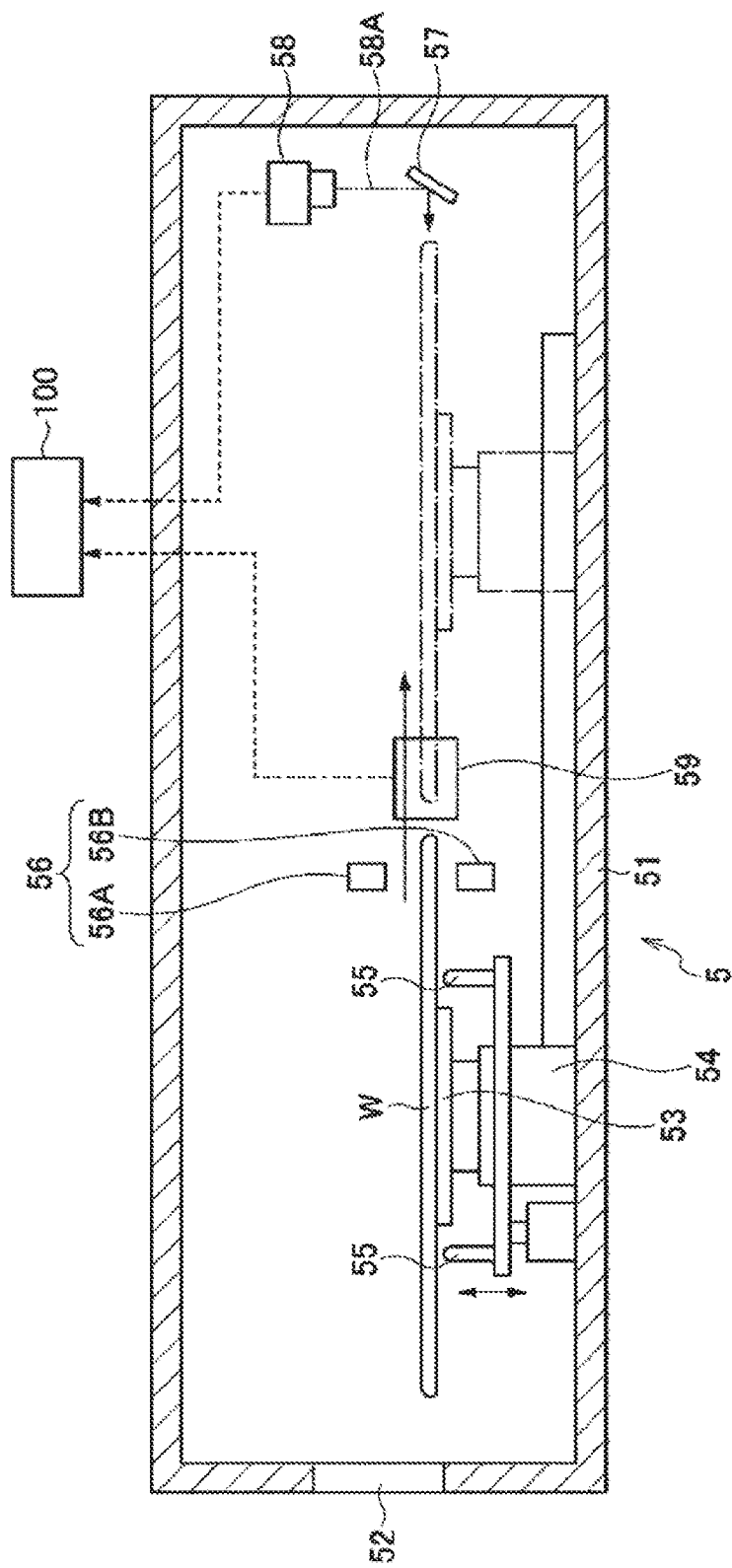
FIG. 10 is a vertical sectional side view of an imaging module for acquiring a height distribution of an inclined surface of a wafer.
Figure 11:
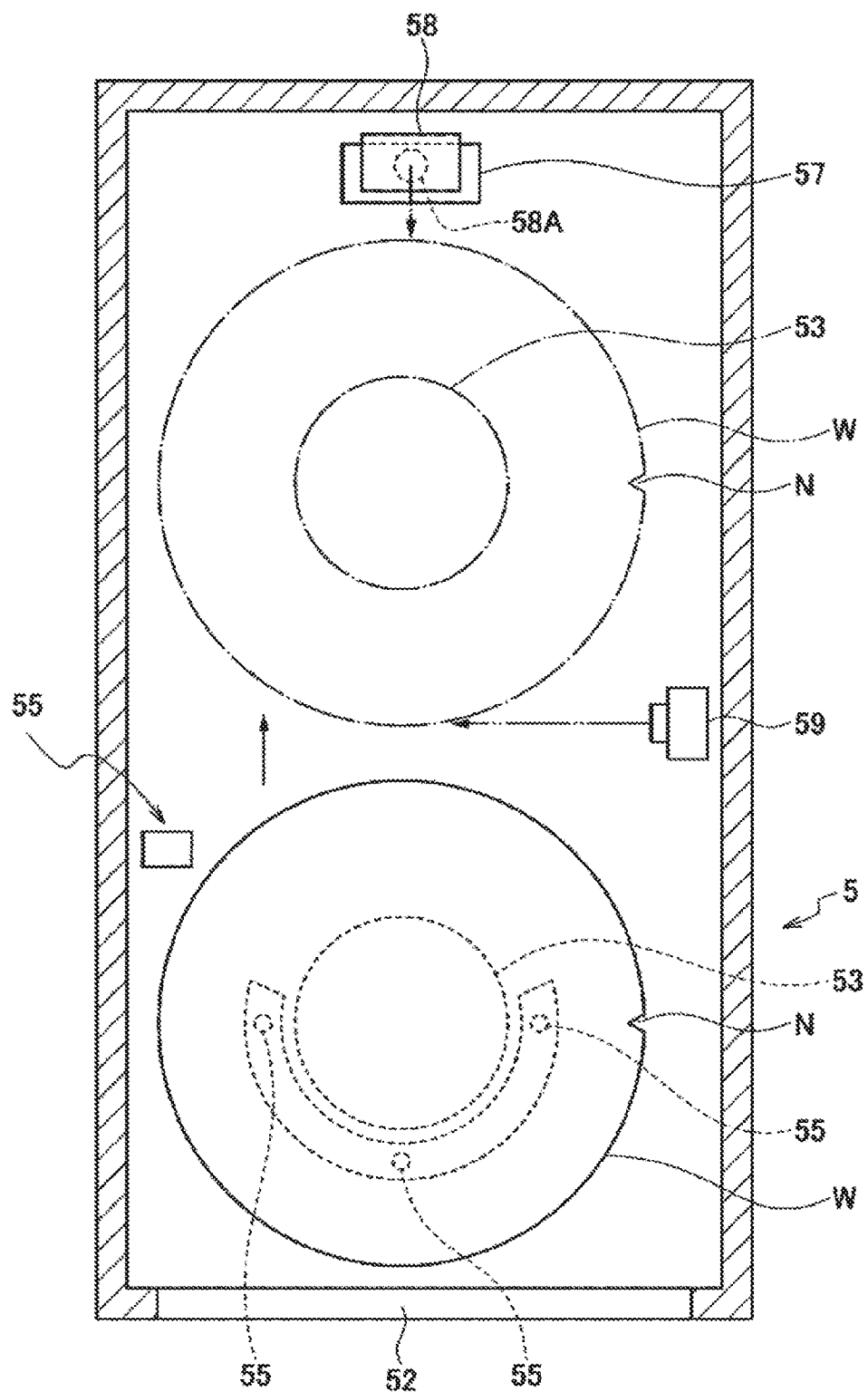
FIG. 11 is a horizontal sectional plan view of the imaging module.

Subsequently, the imaging module 5, which is a height distribution acquisition module, will be described with reference to the vertical sectional side view and the horizontal sectional plan view of FIGS. 10 and 11. The imaging module 5 captures an image of the peripheral edge portion of the wafer W so that the control part 100 can obtain the height distribution along the radial direction in the peripheral edge portion of the surface of the wafer W, and transmits the captured image to the control part 100. In FIGS. 10 and 11, reference numeral 51 denotes a casing, and reference numeral 52 denotes a transfer port for the wafer W which is opened in the side wall of the casing 51. Reference numeral 53 denotes a stage for attracting the central portion of the rear surface of the wafer W and horizontally holding the wafer W. The stage 53 is configured so that it can be rotated by a drive mechanism 54 and can be moved between the front side (the side of the transfer port 52) of the casing 51 and the back side thereof. In FIGS. 10 and 11, reference numeral 55 denotes lift pins for transferring the wafer W between the transfer mechanism 19 and the stage 53 as a first mounting part.

In FIGS. 10 and 11, reference numeral 55 denotes a transmissive photoelectric sensor which includes a light emitting part 56A located above the stage 53 and a light receiving part 56B located below the stage 53. The stage 53 slightly advances from the position where the wafer W is received from the transfer mechanism 19 (the position indicated by a solid line in FIG. 10) and makes one rotation. During this rotation, light is irradiated downward from the light emitting part 56A so that a part of the light is blocked by the peripheral edge portion of the wafer W and another part of the light is irradiated on the light receiving part 56B after passing through the side of the wafer W. Then, the control part 100 detects a notch N based on the amount of light received by the light receiving part 56B.

A mirror 57 and a camera 58 are provided on the back side in the casing 51. In FIGS. 10 and 11, the two-dot chain line arrow denoted by 58A indicates the optical axis of the camera 58. The optical axis 58A directed downward from the camera 58 is reflected by the mirror 57 and directed in the horizontal direction. The optical axis 58A directed in the horizontal direction in this way coincides with the extension line of the diameter of the wafer W at the imaging position where imaging is performed (the position indicated by the one-dot chain line in FIGS. 10 and 11). This enables the camera 58 to capture an image of the side surface of the wafer W.

A camera 59 which is a first imaging mechanism is provided inside the casing 51. The two-dot chain line arrow denoted by 59A in FIGS. 10 and 11 indicates the optical axis of the camera 59 which extends along the tangential direction of the wafer W. Thus, the camera 59 may capture an image of the side end portion of the wafer W at the imaging position from the lateral side of the wafer W. In the imaging module 5, in addition to the cameras 58 and 59, cameras for respectively capturing an image of the entire front surface of the wafer W and an image of the peripheral edge portion of the rear surface of the wafer W are provided in order to inspect the state of the entire front surface of the wafer W and to inspect the presence or absence of a foreign substance on the peripheral edge portion of the rear surface of the wafer W. However, the illustration of these cameras is omitted in order to avoid complication of illustration and description.

Figure 12:
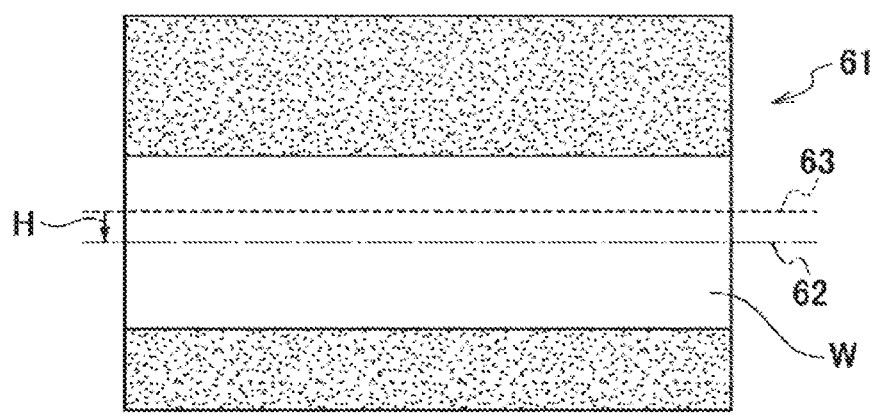
FIG. 12 is an explanatory view showing an image of a side surface of a wafer acquired by the imaging module.

The imaging of the wafer W in the imaging module 5 and the processing in the control part 100 until the height distribution of the peripheral edge portion of the wafer W is obtained from the acquired image data will be described. First, when the wafer W is transferred to the stage 53, the notch N is detected as described above, and the wafer W is rotated so that the notch N is oriented in a predetermined direction. Then, the wafer W is moved to the imaging position, the imaging by the camera 58 as a second imaging mechanism is performed, and the image data 61 as shown in FIG. 12, for example, is acquired by the control part 100. Then, the vertical center position 62 (indicated by a one-dot chain line in FIG. 12) of the wafer W in the image data 61 is detected, and the vertical shift amount H of the center position 62 with respect to a predetermined reference position 63 (indicated by a dotted line in FIG. 12) is calculated. For example, when the peripheral edge portion of the wafer W is inclined with respect to the horizontal plane due to the warping of the wafer W, the shift amount H is a value other than 0. When the peripheral edge portion of the wafer W is not inclined with respect to the horizontal plane, the shift amount H becomes 0. In the example of FIG. 12, there is shown the image data 61 when the shift amount H is a value other than 0.

Figure 13:
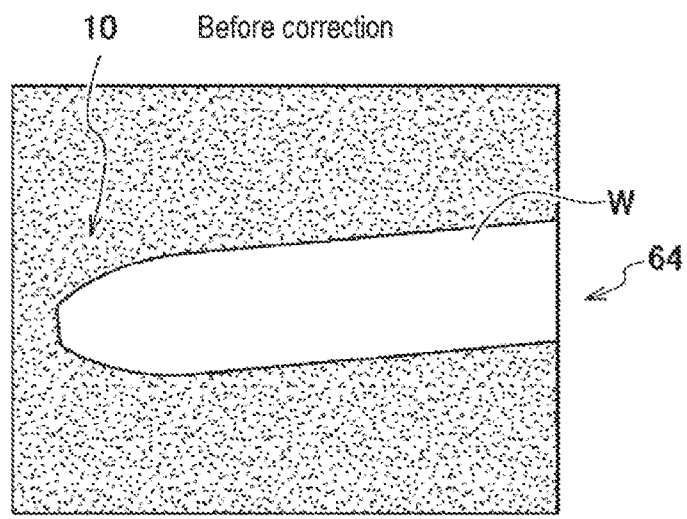
FIG. 13 is an explanatory view showing an image of a side end portion of a wafer acquired by the imaging module.

Subsequently, the wafer W is rotated by 180° so that the camera 59 can capture the image of the location of the peripheral edge portion of the wafer W imaged by the camera 58. After rotation of the wafer W, imaging is performed by the camera 59, and an image data 64 is acquired by the control part 100. FIG. 13 shows an example of the image data 64. The acquired image data 64 is corrected on the basis of the shift amount H described above. Specifically, the image data 64 is corrected such that the image is inclined by an amount corresponding to the shift amount H, and the front surface of the wafer W inside the inclined surface 10 is made horizontal.

Figure 14:
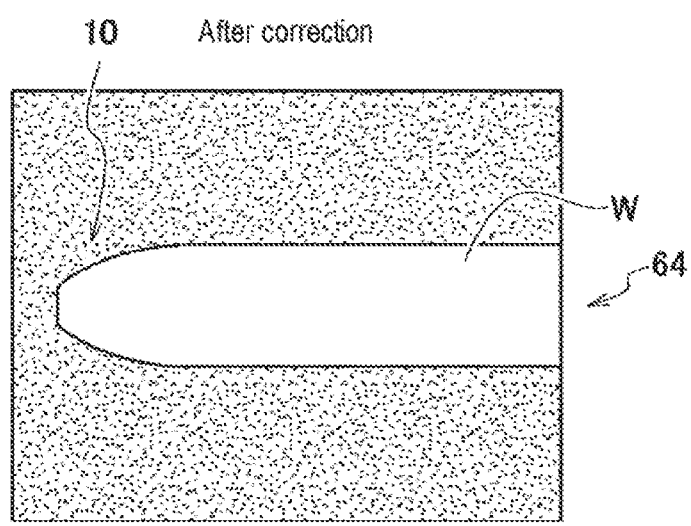
FIG. 14 is an explanatory view showing an image of a side end portion of a wafer acquired by the imaging module.
Figure 15:
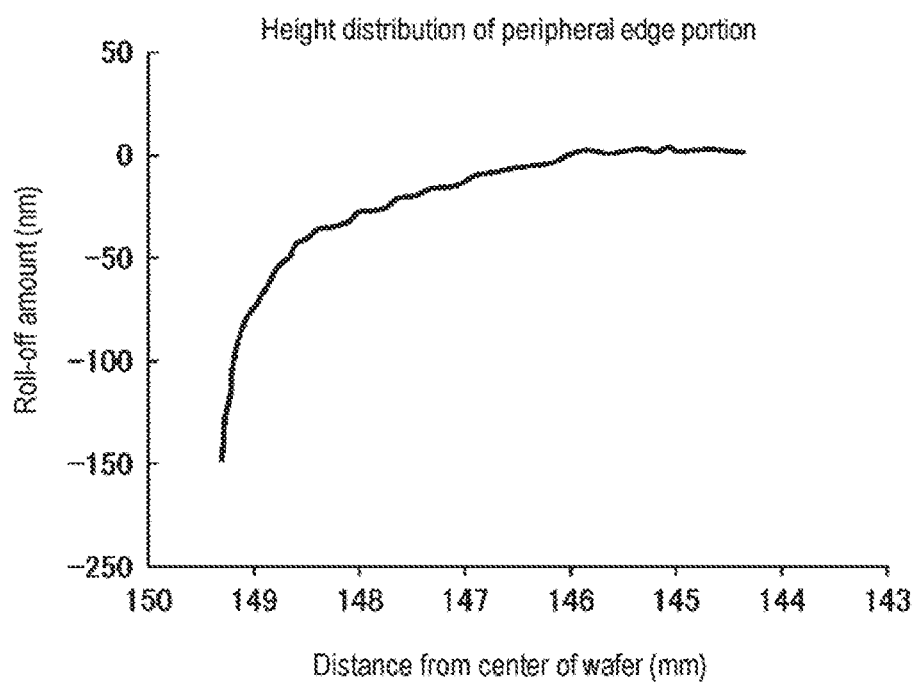
FIG. 15 is a graph showing a height distribution of an inclined surface of a wafer.

FIG. 14 shows the image data 64 corrected in this manner Based on the corrected image data 64, for example, as shown in FIG. 15, the height distribution along the radial direction on the front surface of the peripheral edge portion of the wafer W described above is acquired. The horizontal axis and the vertical axis of the graph of FIG. 15 indicate the distance from the center of the wafer W and the edge roll-off amount, respectively, just like the graph of FIG. 7. The calculation of the shift amount H, the correction of the image data 64, and acquisition of the height distribution of the peripheral edge portion of the wafer W based on the corrected image data 64 are performed by the control part 100 that constitutes a calculation part.

Next, the transfer and processing of the wafer W in the system including the coating and developing apparatus 1 and the exposure apparatus D4 will be described with reference to FIGS. 16 to 20 showing the surface states of the wafer W. The wafers W are divisionally transferred to one of two unit blocks E configured in the same manner In the present embodiment, descriptions will be made under the assumption that the wafers W are transferred to E1, E3 and E5 among the unit blocks E1 to E6.

For example, the wafer W having the inclined surface 10 shown in FIG. 6 is transferred from the carrier C to the transfer module TRS0 of the tower T1 in the processing block D2 by the transfer mechanism 13. Thereafter, the wafer W is transferred to the imaging module 5 by the transfer mechanism 19. As described above, the imaging module 5 performs the detection of the notch N, the adjustment of the orientation of the wafer W, the acquisition of the image data 61 described with reference to FIG. 12, the detection of the vertical shift amount H of the wafer W based on the image data 61, the acquisition of the image data 64 of the peripheral edge portion of the wafer W described with reference to FIG. 13, the correction of the image data 64 based on the shift amount H described with reference to FIG. 14, and the acquisition of the height distribution along the radial direction of the wafer W in the peripheral edge portion of the front surface of the wafer W described with reference to FIG. 15.

From the first to third film thickness distributions of the SOC film described with reference to FIG. 5 and the height distribution of the peripheral edge portion of the wafer W acquired by the imaging module 5, the height distribution of the surface of the SOC film is acquired as described with reference to FIGS. 7 to 9. More specifically, the sum of the film thickness defined by the first to third film thickness distributions at the position having the same distance from the center of the wafer and the acquired height of the peripheral edge portion is calculated. Three kinds of height distributions of the surface of the SOC film as shown in FIG. 9, i.e., the one calculated using the first film thickness distribution, the one calculated using the second film thickness distribution and the one calculated using the third film thickness distribution, are acquired. Subsequently, among the three kinds of height distribution of the surface of the SOC film, the one having the smallest variation of film thickness of each part, i.e., the one having the highest flatness is determined. Then, the SOC film is formed with the film thickness distribution used for calculating the determined height distribution of the surface of the SOC film, among the first to third film thickness distributions. The above calculations and determinations are performed by the control part 100.

Figure 16:
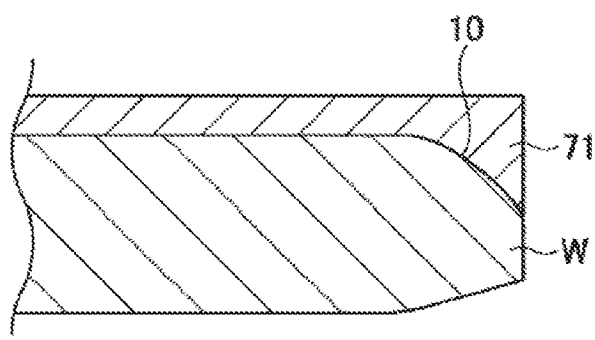
FIG. 16 is a vertical sectional side view of a peripheral edge portion of a wafer.

The wafer W, on which the film thickness distribution of the SOC film thus formed is determined, is conveyed from the imaging module 5 to the transfer module TRS1 of the tower T1 corresponding to the unit block E1 by the transfer mechanism 19 and is transferred to the SOC film forming module 3 by the transfer arm F1. Then, as described with reference to FIG. 4, the spin coating of the chemical liquid is performed. After the chemical liquid is spread from the central portion of the surface of the wafer W to the peripheral edge portion thereof, the opening degree of the damper 39 is adjusted to the opening degree for obtaining the determined film thickness distribution of the SOC film among the first to third opening degrees. Then, the chemical liquid on the front surface of the wafer W is dried by being exposed to an exhaust flow. In the end portion of the wafer W, an SOC film 71 is formed on the entire front surface of the wafer W so as to have the determined film thickness distribution among the first to third film thickness distributions (FIG. 16). That is, the SOC film 71 is formed on the inclined surface 10 so that the edge roll-off of the surface of the SOC film 71 is more highly suppressed than the inclined surface 10.

Thereafter, the wafer W is transferred to the heating module 15 by the transfer arm F1 and is heated by the heating module 15. Then, the wafer W is transferred to the transfer module TRS1. Subsequently, the wafer W is transferred by the transfer mechanism 19 to the transfer module TRS3 corresponding to the unit block E3. Then, the wafer W is transferred to the antireflection film forming module 16 by the transfer arm F3. A chemical liquid is coated by spin coating just like the processing performed in the SOC film forming module 3, whereby an antireflection film 72 is formed on the entire surface of the wafer W. The antireflection film 72 is formed so as to have a uniform film thickness at each portion in the plane of the wafer W. Since the edge roll-off of the SOC film 71 under the antireflection film 72 is suppressed in the peripheral edge portion of the wafer W as described above, the edge roll-off is suppressed also on the surface of the antireflection film 72.

Figure 17:
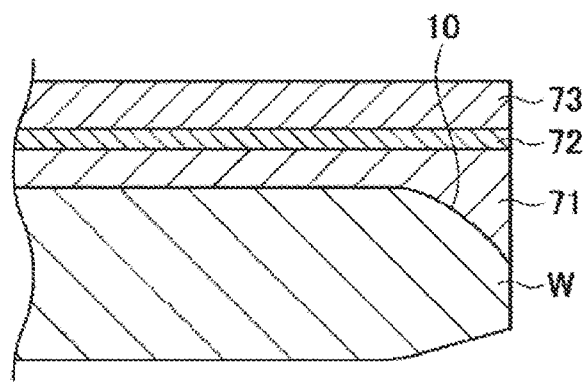
FIG. 17 is a vertical sectional side view of a peripheral edge portion of a wafer.

Thereafter, the wafer W is transferred to the heating module 15 by the transfer arm F3 and is heated by the heating module 15. Then, the wafer W is transferred to the resist film forming module 17. Similar to the processing performed in the SOC film forming module 3, a resist is coated by spin coating, whereby a resist film 73 is formed on the entire surface of the wafer W (FIG. 17). The resist film 73 is also formed so as to have a uniform film thickness at each portion in the plane of the wafer W. Since the edge roll-off of the SOC film 71 under the resist film 73 is suppressed in the peripheral edge portion of the wafer W as described above, the edge roll-off is also suppressed on the surface of the resist film 73.

Figure 18:
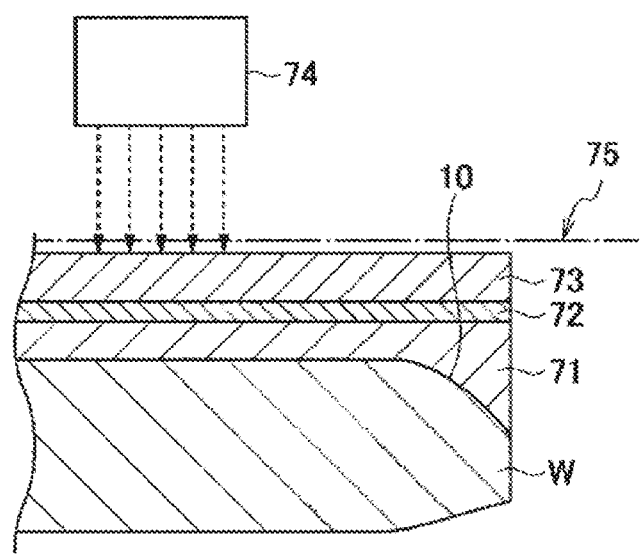
FIG. 18 is a vertical sectional side view of a peripheral edge portion of a wafer.
Figure 19:
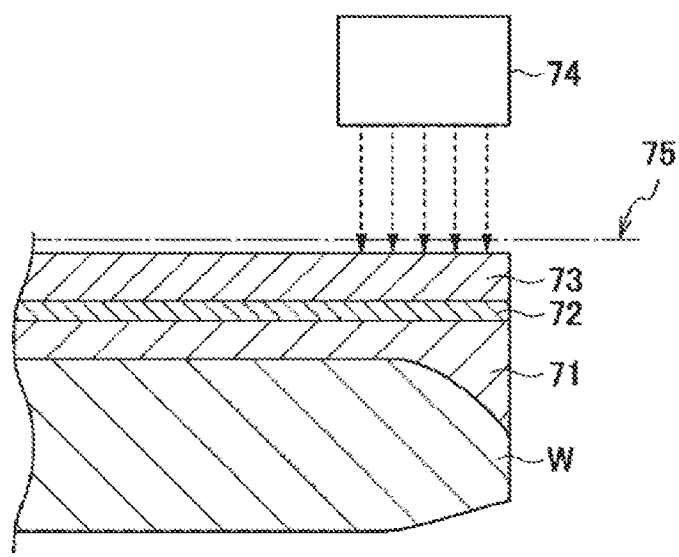
FIG. 19 is a vertical sectional side view of a peripheral edge portion of a wafer.

Thereafter, the wafer W is transferred by the transfer arm F3 in the order of the heating module 15→the transfer module TRS31 of the tower T2. Subsequently, the wafer W is loaded into the exposure apparatus D4 via the tower T3 by the interface arms 21 and 23. In the exposure apparatus D4, an exposure head 74 that irradiates an exposure beam moves over the front surface of the wafer W, whereby exposure processing is performed on each region of the wafer W (FIG. 18). The dotted arrows in FIG. 18 indicate the exposure beam. Reference numeral 75 in FIG. 18 denotes a focus surface of the exposure head 74. Since the edge roll-off of the resist film 73 is suppressed as described above, in the peripheral edge portion of the wafer W, exposure processing can be performed in the region including the peripheral edge portion of the wafer W in a state in which the deviation between the surface of the resist film 73 and the focus surface 75 is suppressed (FIG. 19).

Figure 20:
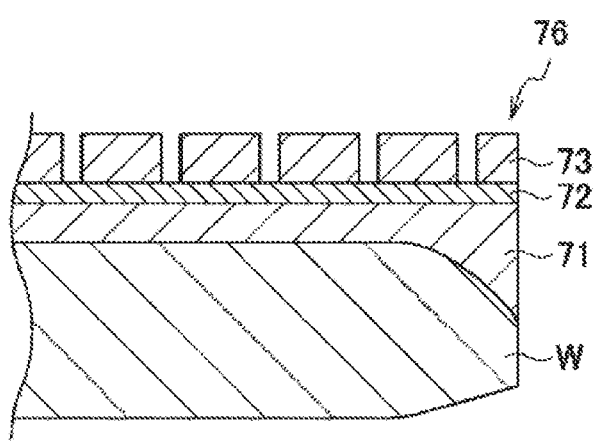
FIG. 20 is a vertical sectional side view of a peripheral edge portion of a wafer.

The wafer W subjected to the exposure is transferred between the towers T2 and T4 by the interface arms 22 and 23 and is transferred to the transfer module TRS51 of the tower T2 corresponding to the unit block E5. The wafer W is transferred by the transfer arm F5 in the order of the heating module 15→the development module 18 and is subjected to development processing. Since the exposure is performed so that the deviation between the focus surface 75 and the surface of the resist film 73 is suppressed in the peripheral edge portion of the wafer W, as described above, a resist pattern 76 is formed so that the CD has a designed value in the peripheral edge portion of the wafer W (FIG. 20). Thereafter, the wafer W is transferred in the order of the transfer arm F5→the heating module 15→the transfer module TRS5 of the tower T1→the transfer mechanism 13, and is returned to the carrier C by the transfer mechanism 13. When the wafer W is transferred to the unit blocks E2, E4 and E6 and subjected to processing, the transfer arms F2, F4 and F6 are used. As the transfer modules TRS of the towers T1 and T2, the modules having a height corresponding to the unit blocks E2, E4 and E6 are used in place of the modules having a height corresponding to the unit blocks E1, E3 and E5.

According to the coating and developing apparatus 1, the height distribution along the radial direction of the wafer W in the peripheral edge portion of the front surface of the wafer W is acquired based on the image data 64 obtained by imaging the side end portion of the wafer W from the lateral side with the imaging module 5. The SOC film is formed by setting the opening degree of the damper 39 in the SOC film forming module 3 so that the drop of the height in the peripheral edge portion is corrected based on the acquired height distribution. Since the resist film is laminated on the SOC film after forming the SOC film, the drop of the height in the peripheral edge portion of the wafer W is suppressed on the surface of the resist film. As a result, it is possible to suppress the deviation between the focus surface and the resist film at the time of exposure and to suppress occurrence of an abnormal CD of the resist pattern in the peripheral edge portion of the wafer W.

In the coating and developing apparatus 1, the image data 64 acquired by the camera 59 is corrected on the basis of the image data 61 acquired by the camera 58 that captures an image of the side surface of the wafer W. The distribution of the height position of the peripheral edge portion of the wafer W is acquired based on the corrected image data 64. Since the control part 100 can accurately grasp the distribution of the height position of the inclined surface 10, it is possible to form the SOC film so that the flatness of the surface in the peripheral edge portion of the wafer W becomes higher in a reliable manner.

Figure 21:
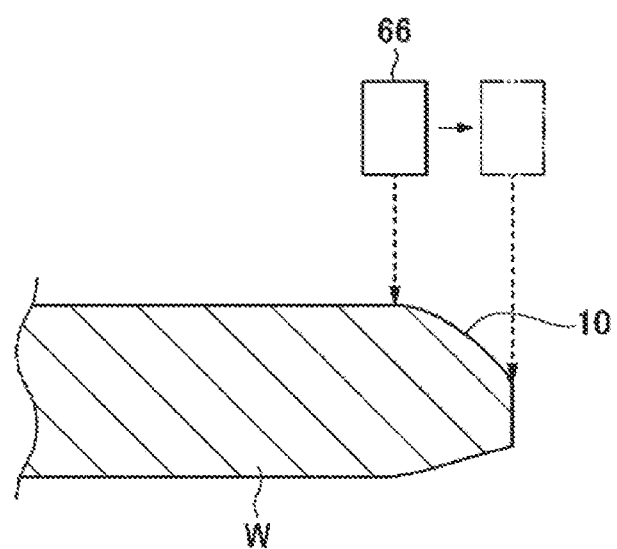
FIG. 21 is a schematic configuration diagram showing a configuration of a module for acquiring a height distribution of a peripheral edge portion of a wafer.

Moreover, the distribution of the height position of the inclined surface 10 along the radial direction in the peripheral edge portion of the wafer W is not limited to being acquired by the image data from the camera 59. For example, a module including a reflective laser type displacement sensor 66 shown in FIG. 21 is provided in the coating and developing apparatus 1. The displacement sensor 66 irradiates laser light vertically downward and receives the laser light reflected by the wafer W. The displacement sensor 66 is connected to a moving mechanism (not shown) so that the displacement sensor 66 can be moved along the radial direction of the wafer W over the end portion of the wafer W mounted on the mounting portion of the module. The displacement sensor 66 is moved while irradiating laser light onto the peripheral edge portion of the wafer W including the inclined surface 10 from the displacement sensor 66. Based on the light received by the displacement sensor 66 during the movement, the control part 100 acquires the height distribution in the peripheral edge portion of the front surface of the wafer W.

The present disclosure is not limited to the case where the laser light is continuously irradiated during the movement of the displacement sensor 66. The laser light may be intermittently irradiated on the inclined surface 10 during the movement, the heights at a plurality of spaced-apart positions on the inclined surface 10 may be acquired, and the film thickness distribution of the SOC film may be determined based on the heights thus acquired. In addition, since the SOC film is formed by spin coating, the film thicknesses at the respective positions in the circumferential direction are equal to each other. Therefore, when moving the displacement sensor 66 along the radial direction of the wafer W, the wafer W may not be kept stationary, but may be rotated to acquire the height distribution of the surface of the peripheral edge portion.

In addition, in the coating and developing apparatus 1 described above, the reason why the thickness of the resist film is not made larger toward the peripheral end so as to correspond to the height distribution of the inclined surface 10 is that if the thickness of each portion in the plane of the resist film fluctuates, the CD of the resist pattern also fluctuates in each portion in the plane of the resist film. However, instead of the SOC film, the antireflection film may be formed so as to become thicker toward the peripheral end just like the SOC film based on the height distribution of the peripheral edge portion of the wafer W, and the surface of the peripheral edge portion of the antireflection film may be made flat. In addition, the film thickness distributions of the SOC film and the antireflection film may be adjusted together, based on not only the film thickness distribution of one of the antireflection film and the SOC film but also the acquired height distribution of the peripheral edge portion of the wafer W.

Incidentally, since the antireflection film is used as a hard mask in an etching step which is a post-process of photolithography, if the thickness thereof is large, time is taken to remove the antireflection film by etching. Thus, there may be a case where it is required to make the film thickness of the antireflection film relatively small. However, since the SOC film is an organic film, it is possible to quickly remove the portion of the SOC film having a relatively large film thickness by plasma treatment using oxygen. Therefore, rather than adjusting the film thickness distribution only for the antireflection film out of the SOC film and the antireflection film, it is preferable to adjust only the film thickness distribution for the SOC film or to adjust the film thickness distributions of both the SOC film and the antireflection film so as to suppress the increase in the film thickness of the antireflection film. The antireflection film forming the underlayer film of the resist film may be made of an organic material or may be made of an inorganic material such as silicon nitride or silicon oxide.

Figure 22:
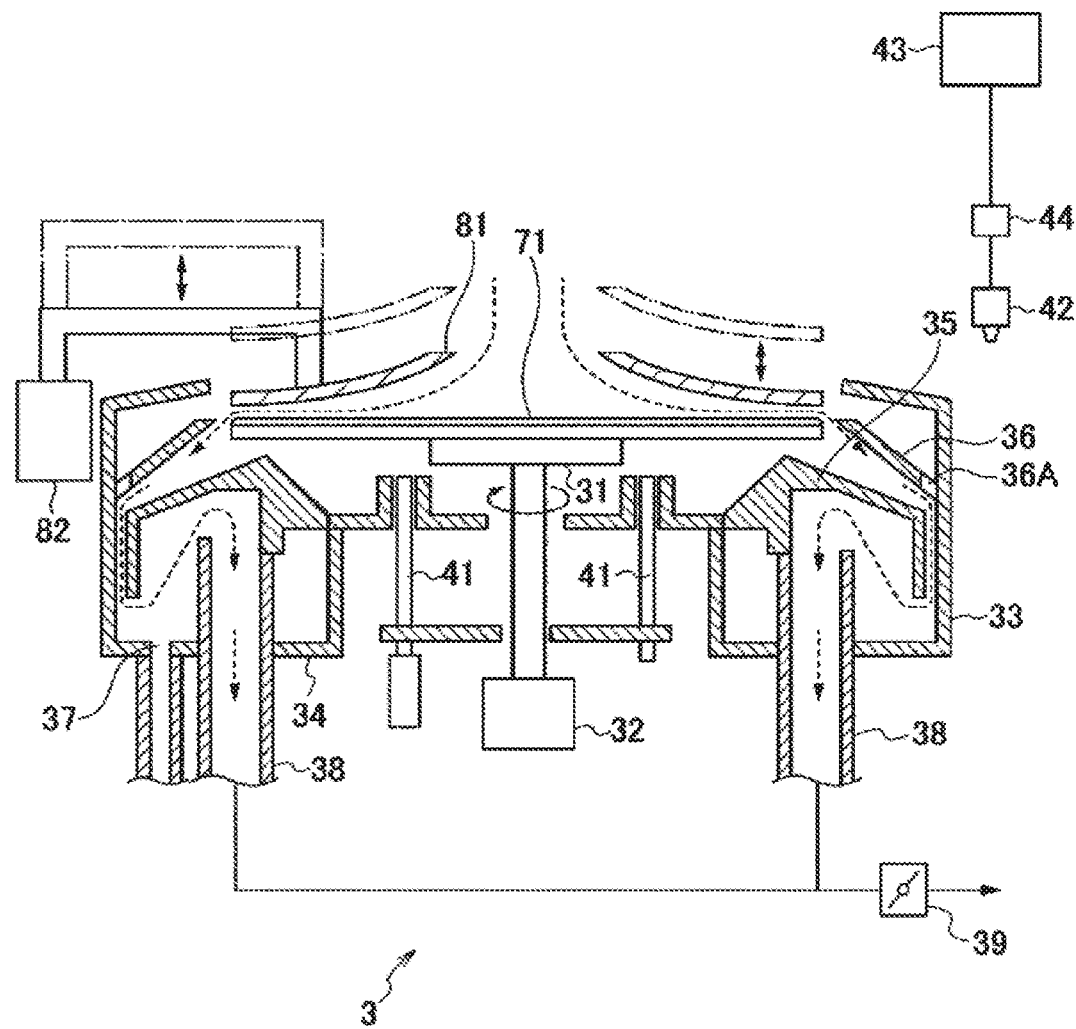
FIG. 22 is a vertical sectional side view showing another configuration example of the SOC film forming module.

On the other hand, the adjustment of the film thickness distribution of the SOC film is not limited to being adjusted by the opening degree of the damper 39 described above. FIG. 22 shows an example in which a baffle plate 81 is provided in the SOC film forming module 3. The baffle plate 81 is formed in a ring shape along the peripheral edge portion of the wafer W so as to cover the peripheral edge portion of the wafer W. Further, the baffle plate 81 is configured to be moved up and down by a lifting mechanism 82. The baffle plate 81 is disposed at a height position slightly upward away from the front surface of the wafer W during the chemical liquid drying period described above. As indicated by the dotted line arrows in FIG. 22, the chemical liquid on the peripheral edge portion of the wafer W is dried while being exposed to the exhaust flow that flows from the central opening of the baffle plate 81 to the lower surface of the baffle plate 81 and further flows between the lower surface of the baffle plate 81 and the front surface of the rotating wafer W along the radial direction of the wafer W, whereby the SOC film 71 is formed.

As the distance between the baffle plate 81 and the front surface of the wafer W grows smaller, the flow velocity of the exhaust flow flowing in the peripheral edge portion of the wafer W becomes higher and the chemical liquid dries faster. Therefore, it is possible to make the SOC film thicker on the side of the peripheral end of the wafer W. In other words, by changing the height of the baffle plate 81, it is possible to change the film thickness distribution of the SOC film 71 at the peripheral end of the wafer W. Accordingly, during the chemical liquid drying period, the baffle plate 81 is disposed at the height corresponding to the acquired height distribution of the peripheral edge portion of the wafer W, and the chemical liquid on the front surface of the wafer W is dried, whereby the SOC film 71 in which the edge roll-off is suppressed can be formed in the peripheral edge portion of the wafer W.

Figure 23:
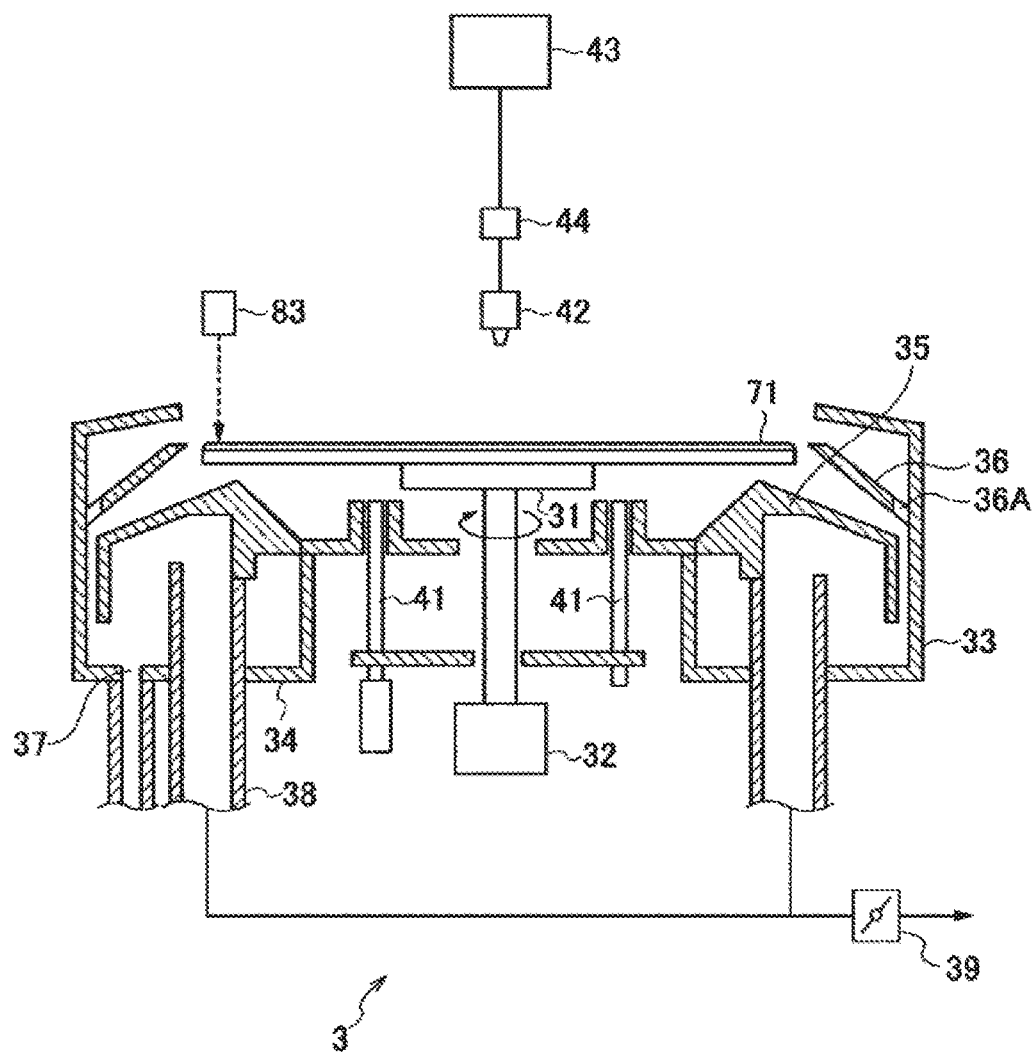
FIG. 23 is a vertical sectional side view showing a further configuration example of the SOC film forming module.

Furthermore, the adjustment of the film thickness distribution of the SOC film is not limited to controlling the exhaust flow in the peripheral edge portion of the wafer W. The SOC film forming module 3 shown in FIG. 23 is provided with a light irradiation part 83 formed of an LED and configured to irradiate light vertically downward on the peripheral edge portion of the wafer W held by the spin chuck 31. The light irradiation part 83 locally heats the peripheral edge portion of the wafer W by irradiating the wafer W with light. The irradiation intensity of light by the light irradiation part 83 is adjustable. As the irradiation intensity grows higher, the temperature of the peripheral edge portion of the wafer W becomes higher and the chemical liquid dries faster. Accordingly, during the chemical liquid drying period, light is irradiated from the light irradiation part 83 to the peripheral edge portion of the rotating wafer W at the irradiation intensity corresponding to the acquired height distribution of the peripheral edge portion of the wafer W, and the peripheral edge portion of the wafer W is heated so as to have a temperature corresponding to the height distribution, whereby the SOC film 71 in which edge roll-off is suppressed can be formed in the peripheral edge portion of the wafer W.

Figure 24:
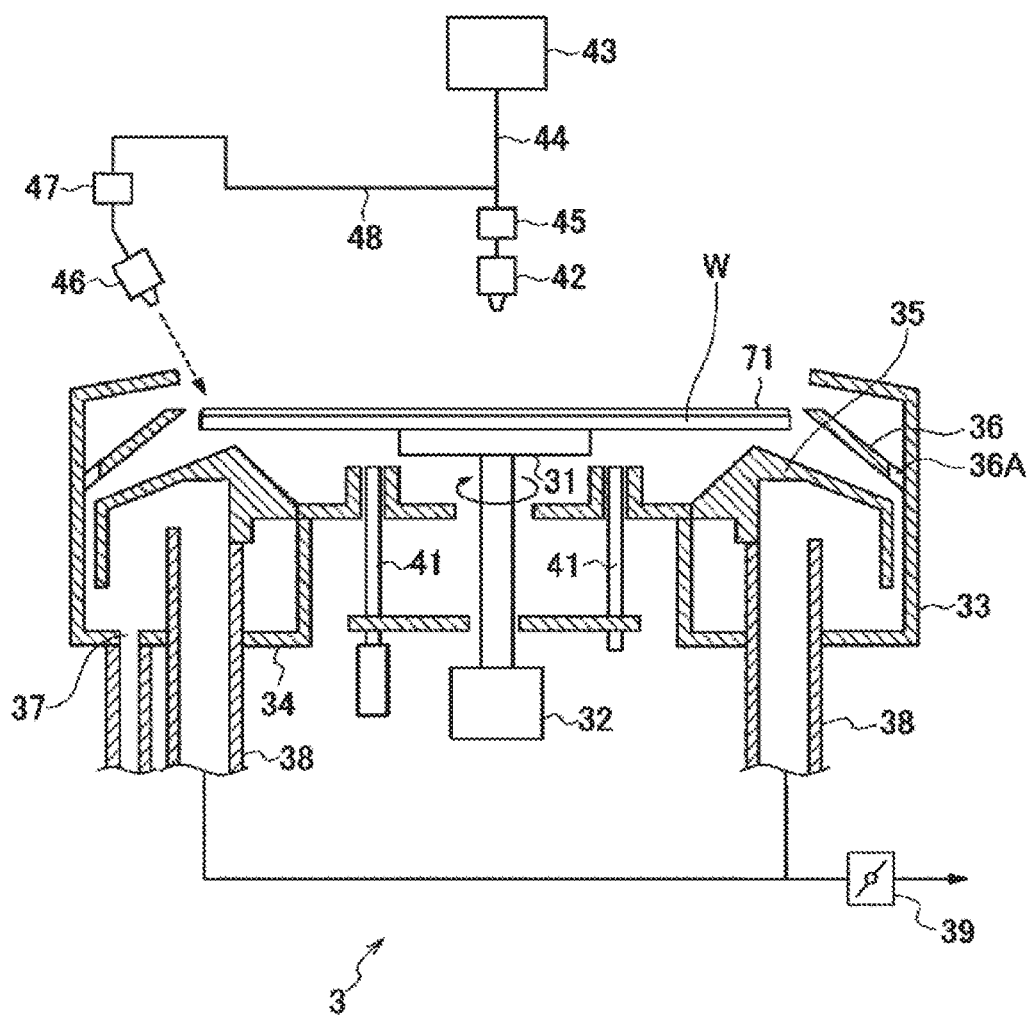
FIG. 24 is a vertical sectional side view showing a still further configuration example of the SOC film forming module.

The SOC film forming module 3 shown in FIG. 24 is provided with a nozzle 46 capable of locally discharging a chemical liquid for the formation of an SOC film toward the peripheral edge portion of the wafer W. Reference numeral 47 in FIG. 24 denotes a chemical liquid flow rate adjustment part installed in a chemical liquid supply pipe 48 which connects the nozzle 46 and the chemical liquid supply source 43. After the chemical liquid is coated on the entire front surface of the wafer W by spin coating as described above and the SOC film is formed by drying the chemical liquid, the chemical liquid is supplied to the rotating wafer W from the nozzle 46. That is, in the SOC film forming module 3 of FIG. 24, the chemical liquid for the formation of the SOC film is overlappingly coated on the peripheral edge portion of the wafer W. During the overlappingly performed coating, the flow rate of the chemical liquid supplied to the nozzle 46 by the flow rate adjustment part 47 and the rotation speed of the wafer W are controlled based on the acquired height distribution of the peripheral edge portion of the wafer W. The chemical liquid is coated on the peripheral edge portion so that the film thickness with suppressed edge roll-off can be obtained. In addition to the above-described method, by setting the rotation speed of the wafer W during the chemical liquid drying period based on the height distribution of the inclined surface 10, the edge roll-off may be suppressed in the peripheral edge portion of the SOC film.

The respective apparatus configuration examples described above may be implemented in combination. While there has been described the method of adjusting the thickness distribution of the SOC film by adjusting the opening degree of the damper 39 or by adjusting the irradiation amount of light irradiated from the light irradiation part 83, the film thickness distribution of the SOC film may be adjusted by changing both the opening degree of the damper 39 and the irradiation amount of light irradiated from the light irradiation part 83.

(Evaluation Test)

Figure 25:
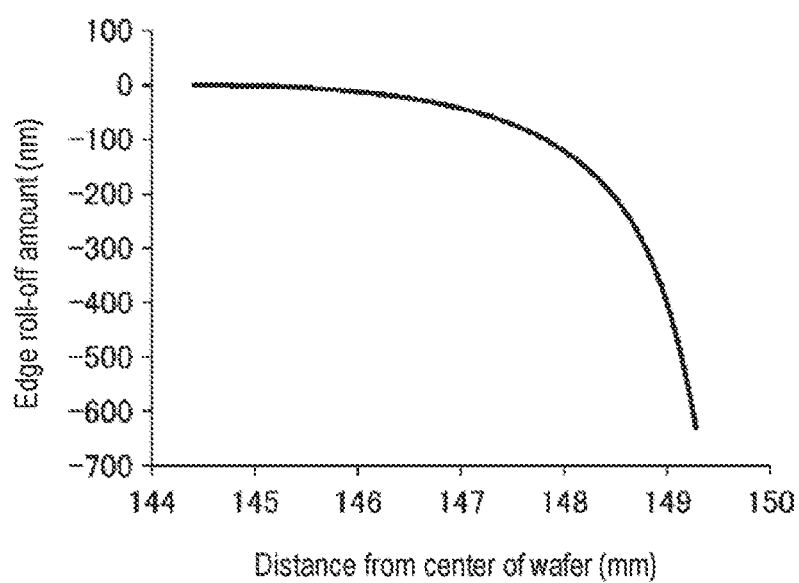
FIG. 25 is a graph showing a height distribution of an inclined surface of a wafer.

Evaluation test 1 conducted in connection with the present disclosure will be described. An SOC film, an antireflection film and a resist film were formed on a wafer W whose peripheral edge portion has a height distribution as shown in the graph of FIG. 25. Exposure and development were performed to form a resist pattern. The horizontal axis and the vertical axis of the graph indicate the distance from the center of the wafer W and the roll-off amount, respectively, just like the graph of FIG. 7. The wafer W used in evaluation test 1 is a polished wafer. However, in evaluation test 1, unlike the embodiment described above, the films were formed so that the film thickness of each film is uniform over the entire front surface of the wafer W. After forming the resist pattern, the CD in the plane of the wafer W was measured.

Figure 26:
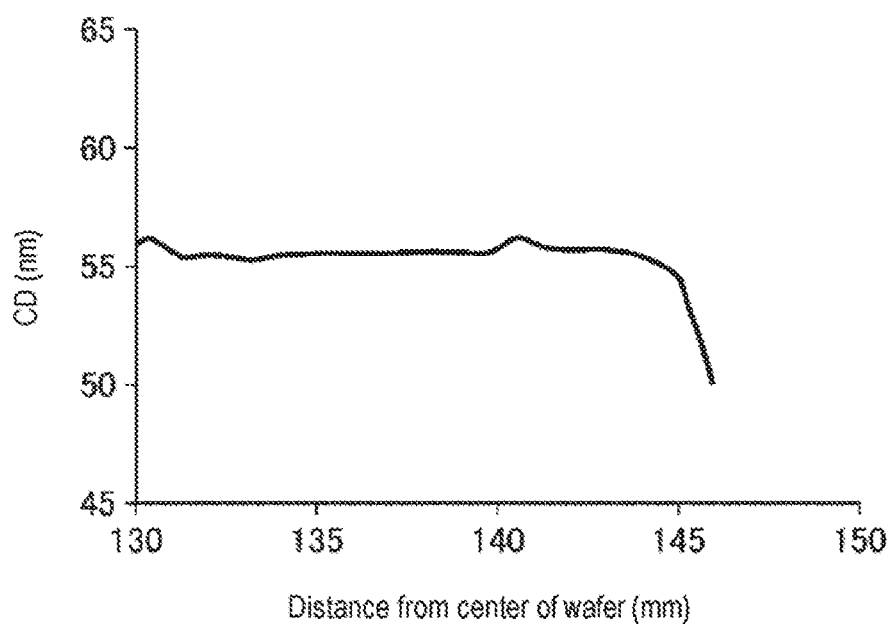
FIG. 26 is a graph showing a CD distribution of a wafer.

The graph of FIG. 26 shows the measurement result of CD. The horizontal axis and the vertical axis of the graph indicate the distance (unit: mm) from the center of the wafer W and the CD (unit: nm), respectively. As shown in the graph of FIG. 26, when viewed from the center side toward the peripheral end, the wafer W used in evaluation test 1 has an edge roll-off amount of 0 mm in the region up to 145 mm from the center of the wafer W. In the region beyond 145 mm, the absolute value of the edge roll-off amount gradually increases. In the graph of FIG. 26, when viewed from the center side toward the peripheral end of the wafer W, the CD is kept substantially at the same value in the region up to 145 mm from the center of the wafer W. However, in the region beyond 145 mm, a decrease in CD is seen. As described above, it was confirmed from the result of evaluation test 1 that the fluctuation of CD corresponds to the edge roll-off amount. Therefore, it is effective to suppress the fluctuation of CD by suppressing the edge roll-off using the method described in the above embodiment of the present disclosure.

What is claimed is:

1. A substrate processing method, comprising:
   acquiring a height distribution along a radial direction of a substrate in a peripheral edge portion of a front surface of the substrate;
   forming an underlayer film on the entire front surface of the substrate so as to correct a drop of a height of the peripheral edge portion based on the height distribution; and
   forming a resist film on the entire surface of the underlayer film.

2. The method of claim 1, wherein the acquiring the height distribution is performed based on a first image data acquired by capturing an image of a side end portion of the substrate mounted on a first mounting part using a first imaging mechanism.

3. The method of claim 2, wherein the acquiring the height distribution is performed by detecting a vertical shift of an end portion of the substrate mounted on the first mounting part with respect to a reference position.

4. The method of claim 3, wherein the detecting the positional shift is performed based on a second image data acquired by capturing an image of a side surface of the substrate mounted on the first mounting part using a second imaging mechanism.

5. The method of claim 1, wherein the forming the underlayer film includes:
 a chemical liquid supply process of supplying a chemical liquid for formation of the underlayer film to a central portion of a front surface of a substrate mounted on a second mounting part provided in a cup;
 a rotation process of rotating the second mounting part to spread the chemical liquid to a peripheral edge portion of the front surface of the substrate by a centrifugal force and to dry the chemical liquid; and
 an adjustment process of adjusting a drying speed of the chemical liquid in the peripheral edge portion of the substrate according to the height distribution during the rotation process.

6. The method of claim 5, wherein the adjustment process includes an exhaust process of exhausting an interior of the cup at an exhaust amount corresponding to the height distribution.

7. The method of claim 5, wherein the adjustment process includes a process of locally heating the peripheral edge portion of the substrate so as to obtain a temperature corresponding to the height distribution.

8. The method of claim 5, wherein the adjustment process includes a process of disposing a baffle member provided above the substrate at a height corresponding to the height distribution.

9. A substrate processing apparatus, comprising:
 a height distribution acquisition module configured to acquire a height distribution along a radial direction of a substrate in a peripheral edge portion of a front surface of the substrate; and
 an underlayer film forming module configured to form an underlayer film, which is provided under a resist film, on the entire front surface of the substrate so as to correct a drop of a height of the peripheral edge portion based on the height distribution.

10. The apparatus of claim 9, wherein the height distribution acquisition module includes a first mounting part configured to mount the substrate, and a first imaging mechanism configured to acquire a first image data by capturing an image of a side end portion of the substrate mounted on the first mounting part, and
 a calculation part configured to acquire the height distribution based on the first image data is provided.

11. The apparatus of claim 10, wherein the height distribution acquisition module includes a position shift detection mechanism configured to detect a vertical shift of an end portion of the substrate mounted on the first mounting part with respect to a reference position, and
 the calculation part is configured to acquire the height distribution based on the position shift.

12. The apparatus of claim 11, wherein the position shift detection mechanism includes a second imaging mechanism configured to acquire a second image data by capturing an image of a side surface of the substrate mounted on the first mounting part, and
 the calculation part is configured to acquire the height distribution based on the second image data.

13. The apparatus of claim 9, wherein the underlayer film forming module includes:
 a second mounting part provided in a cup and configured to mount the substrate;
 a nozzle configured to supply a chemical liquid for formation of the underlayer film to a central portion of a front surface of the substrate;
 a rotation mechanism configured to rotate the second mounting part to spread the chemical liquid to a peripheral edge portion of the substrate by a centrifugal force and configured to dry the chemical liquid to form the underlayer film; and
 an adjustment mechanism configured to adjust a drying speed of the chemical liquid in the peripheral edge portion of the substrate according to the height distribution during rotation of the substrate.

14. A non-transitory computer-readable storage medium storing a computer program used for a substrate processing apparatus configured to form an underlayer film, which is provided under a resist film, on a substrate,
 wherein the program incorporates processes for executing the substrate processing method of claim 1.

* * * * *